(12) United States Patent
Kwak et al.

(10) Patent No.: US 8,980,689 B2
(45) Date of Patent: Mar. 17, 2015

(54) METHOD OF FABRICATING SEMICONDUCTOR MULTI-CHIP STACK PACKAGES

(71) Applicant: Samsung Electronics Co., Ltd., Suwon-si (KR)

(72) Inventors: Byoung-Soo Kwak, Seoul (KR); Cha-Jea Jo, Bucheon-si (KR); Tae-Je Cho, Hwaseong-si (KR); Sang-Uk Han, Hwaseong-si (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/088,576

(22) Filed: Nov. 25, 2013

(65) Prior Publication Data

US 2014/0273350 A1    Sep. 18, 2014

(30) Foreign Application Priority Data

Mar. 15, 2013   (KR) .................. 10-2013-0028026

(51) Int. Cl.
*H01L 21/44* (2006.01)
*H01L 21/48* (2006.01)
*H01L 21/50* (2006.01)
*H01L 25/00* (2006.01)

(52) U.S. Cl.
CPC .......... *H01L 25/50* (2013.01); *H01L 2924/0002* (2013.01); *H01L 2224/13* (2013.01)
USPC .... 438/106; 438/127; 438/618; 257/E21.006; 257/E21.007; 257/E21.085; 257/E21.266; 257/E21.268; 257/E21.278; 257/E21.293; 257/E21.499; 257/E21.502; 257/E21.503; 257/E21.505; 257/E21.511

(58) Field of Classification Search
USPC ......... 438/106, 127, 618, 107, 110, 118, 122, 438/124, 126, 769, 779, 780, 686, 687, 675, 438/700; 257/E21.006, E21.007, E21.085, 257/E21.267, E21.266, E21.268, E21.278, 257/E21.293, E21.499, E21.502, E21.503, 257/E21.505, E21.511
See application file for complete search history.

(56) References Cited

U.S. PATENT DOCUMENTS 6,174,751 B1   1/2001   Oka
6,333,469 B1   12/2001  Inoue et al.
(Continued)

FOREIGN PATENT DOCUMENTS

JP   2000-208556   7/2000
JP   2009-152493   7/2009
(Continued)

*Primary Examiner* — David Nhu
(74) *Attorney, Agent, or Firm* — Muir Patent Consulting, PLLC

(57) ABSTRACT

Provided is a method of fabricating a multi-chip stack package. The method includes preparing single-bodied lower chips having a single-bodied lower chip substrate having a first surface and a second surface disposed opposite the first surface, bonding unit package substrates onto the first surface of the single-bodied lower chip substrate to form a single-bodied substrate-chip bonding structure, separating the single-bodied substrate-chip bonding structure into a plurality of unit substrate-chip bonding structures, preparing single-bodied upper chips having a single-bodied upper chip substrate, bonding the plurality of unit substrate-chip bonding structures onto a first surface of the single-bodied upper chip substrate to form a single-bodied semiconductor chip stack structure, and separating the single-bodied semiconductor chip stack structure into a plurality of unit semiconductor chip stack structures.

20 Claims, 21 Drawing Sheets

(56) References Cited

U.S. PATENT DOCUMENTS

| | | | |
|---|---|---|---|
| 7,211,886 B2 * | 5/2007 | Hsu et al. | 257/686 |
| 7,948,095 B2 | 5/2011 | Ng et al. | |
| 8,110,922 B2 | 2/2012 | Chung et al. | |
| 8,169,065 B2 * | 5/2012 | Kohl et al. | 257/686 |

FOREIGN PATENT DOCUMENTS

| | | |
|---|---|---|
| JP | 2009-253239 | 10/2009 |
| JP | 2009-260225 | 11/2009 |
| JP | 2010-123731 | 6/2010 |
| KR | 10-0922372 | 10/2009 |

\* cited by examiner

METHOD OF FABRICATING SEMICONDUCTOR MULTI-CHIP STACK PACKAGES

CROSS-REFERENCE TO RELATED APPLICATION

This application claims priority under 35 U.S.C. §119 to Korean Patent Application No. 10-2013-0028026 filed on Mar. 15, 2013, the disclosure of which is hereby incorporated by reference in its entirety.

BACKGROUND

This disclosure relates to multi-chip stack packages having various structures, methods of fabricating the multi-chip stack packages, and various electronic systems having the multi-chip stack packages.

To embody high-integrated, high-speed, multifunctional semiconductor devices, a technique of integrating a logic semiconductor device and a memory semiconductor device in a single semiconductor package using a through-via electrode has been proposed.

SUMMARY

Disclosed embodiments provide multi-chip stack packages.

Disclosed embodiments further provide methods of fabricating multi-chip stack packages.

Additional disclosed embodiments provide electronic systems having multi-chip stack packages.

The technical objectives of the disclosure are not limited to the described embodiments; other objectives may become apparent to those of ordinary skill in the art based on the following descriptions.

In one embodiment, a method of fabricating a multi-chip stack package includes preparing single-bodied lower chips having a single-bodied lower chip substrate having a first surface and a second surface disposed opposite the first surface, bonding unit package substrates onto the first surface of the single-bodied lower chip substrate to form a single-bodied substrate-chip bonding structure, separating the single-bodied substrate-chip bonding structure into a plurality of unit substrate-chip bonding structures, preparing single-bodied upper chips having a single-bodied upper chip substrate, bonding the plurality of unit substrate-chip bonding structures onto a first surface of the single-bodied upper chip substrate to form a single-bodied semiconductor chip stack structure, and separating the single-bodied semiconductor chip stack structure into a plurality of unit semiconductor chip stack structures.

Each of the single-bodied lower chip substrate and the single-bodied upper chip substrate may include an uncut silicon wafer.

The method may further include filling a lower molding compound between the first surface of the single-bodied lower chip substrate and the unit package substrates, and filling an upper molding compound between the first surface of the single-bodied upper chip substrate and a surface of single-bodied lower chips opposite the first surface of the the single-bodied lower chip substrate.

The method may further include forming a through-via electrode in the single-bodied lower chip substrate, the through-via electrode having a first end protruding from the first surface of the single-bodied lower chip substrate and a second end disposed in the single-bodied lower chip substrate toward the second surface of the single-bodied lower chip substrate, forming internal circuits and an interlayer insulating layer on the first surface of the single-bodied lower chip substrate, the interlayer insulating layer surrounding the internal circuits, and forming a first pad on the interlayer insulating layer to be connected to the through-via electrode.

The package substrate may include a substrate plate, a chip bump land disposed on one surface of the substrate plate and aligned with the first pad, and a substrate bump land disposed on the other surface of the substrate plate and connected to the chip bump land.

The first pad and the chip bump land may be electrically connected using the chip bump. The lower molding compound may surround side surfaces of the chip bump.

The method may further include partially removing the second surface of the single-bodied lower chip substrate to expose the second end of the through-via electrode, forming a second surface insulating layer on the second surface of the single-bodied lower chip substrate to expose a surface of the second end of the through-via electrode, and forming a second pad through the second surface insulating layer to be electrically connected to the second end of the through-via electrode.

The single-bodied upper chip substrate may include an upper chip pad aligned with the second pad.

The second pad and the upper chip pad may be electrically connected using an inter-chip bump. The upper molding compound may surround side surfaces of the inter-chip bump.

Each of the unit substrate-chip bonding structures may include a unit lower chip substrate into which the single-bodied lower chip substrate is divided, a unit package substrate bonded onto the unit lower chip substrate, and the lower molding compound filled between the unit lower chip substrate and the unit package substrate. The lower molding compound may cover side surfaces of the unit package substrate.

The upper molding compound may cover side surfaces of the unit lower chip substrate, side surfaces of the lower molding compound filled between the unit lower chip substrate and the unit package substrate, and side surfaces of the lower molding compound covering the side surfaces of the unit package substrate.

Each of the unit semiconductor chip stack structures may include a unit upper chip substrate into which the single-bodied upper chip substrate is divided, a unit substrate-chip bonding structure bonded onto the unit upper chip substrate, and the upper molding compound filled between the unit upper chip substrate and the second surface of the unit lower chip substrate of the unit substrate-chip bonding structure. The upper molding compound may cover side surfaces of the unit substrate-chip bonding structure.

In one embodiment, for each single-bodied substrate-chip bonding structure, a horizontal width of the unit package substrate is less than a horizontal width of the lower chip.

In accordance with another embodiment, a method of fabricating a multi-chip stack package includes preparing single-bodied lower chips including a wafer-level lower semiconductor chip substrate, bonding a package substrate onto a first surface of the single-bodied lower chips, filling a lower molding compound between the lower semiconductor chip substrate and the package substrate to form a single-bodied substrate-chip bonding structure, separating the single-bodied substrate-chip bonding structure into a plurality of unit substrate-chip bonding structures, preparing a wafer-level single-bodied upper chips including a wafer-level upper semiconductor chip substrate, bonding the plurality of unit substrate-chip bonding structures onto a first surface of the wafer-level upper semiconductor chip substrate, filling an upper molding compound between the first surface of the upper semiconductor chip substrate and the unit substrate-chip bonding structure to form a single-bodied semiconductor chip stack structure, and separating the single-bodied semiconductor chip stack structure into a plurality of unit semiconductor chip stack structures.

The package substrate may include a plurality of unit package substrates. The lower molding compound may cover side surfaces of the unit package substrates.

The upper molding compound may cover side surfaces of the plurality of unit substrate-chip bonding structures.

In one embodiment, at least one separated lower chip or separated upper chip has a smaller horizontal width than the a separated package substrate on which it is disposed.

In another embodiment, a method of manufacturing a semiconductor device includes: forming a set of lower chips in an unseparated configuration; attaching a plurality of unit package substrates to the set of lower chips, so that conductive terminals at a surface of each unit package substrate align with conductive terminals at a facing surface of each respective lower chip; depositing a molding compound between each unit package substrate and its respective lower chip to form a single-bodied substrate-chip bonding structure; and performing a separation process on the single-bodied substrate-chip bonding structure to form a plurality of unit substrate-chip bonding structures.

Each unit substrate-chip bonding structure may include a unit package substrate having a first horizontal width, and a lower chip having a second horizontal width greater than the first horizontal width.

The molding compound may cover a first surface of the unit package substrate facing the lower chip, and also covers side surfaces of the unit package substrate.

Specific particulars of other embodiments are included in detailed descriptions and drawings.

BRIEF DESCRIPTION OF THE DRAWINGS

The foregoing and other features and advantages disclosed herein will be apparent from the more particular description of various embodiments, as illustrated in the accompanying drawings in which like reference characters refer to the same or similar parts throughout the different views. The drawings are not necessarily to scale, emphasis instead being placed upon illustrating the principles of the disclosed embodiments. In the drawings.

DETAILED DESCRIPTION

Figure 1A:
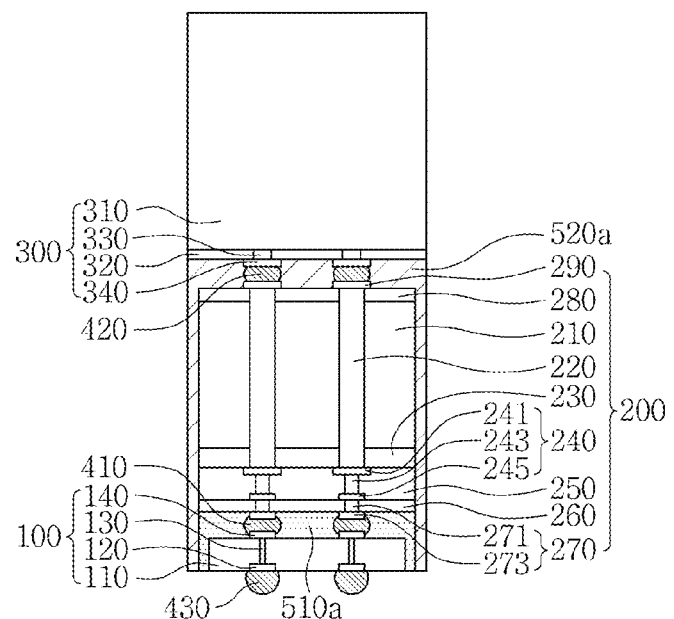
FIGS. 1A through 1C and 2A through 2F are conceptual longitudinal sectional views or side views of multi-chip stack packages according to certain exemplary embodiments.

Various embodiments will now be described more fully with reference to the accompanying drawings in which some embodiments are shown. This inventive concept may, however, be embodied in different forms and should not be construed as limited to the embodiments set forth herein.

The terminology used herein to describe various embodiments is not intended to limit the scope of the invention. The articles "a," "an," and "the" are singular in that they have a single referent, however the use of the singular form in the present document should not preclude the presence of more than one referent. In other words, elements of the invention referred to in the singular may number one or more, unless the context clearly indicates otherwise. It will be further understood that the terms "comprises," "comprising," "includes," and/or "including," when used herein, specify the presence of stated features, items, steps, operations, elements, and/or components, but do not preclude the presence or addition of one or more other features, items, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments are described herein with reference to cross-section and/or plan illustrations that are schematic illustrations of idealized embodiments. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an etched region illustrated as a rectangle will, typically, have rounded or curved features. Thus, the regions illustrated in the figures are schematic in nature and their shapes are not intended to limit the scope of the present invention.

Like numbers refer to like elements throughout. Thus, the same or similar numbers may be described with reference to other drawings even if they are neither mentioned nor described in the corresponding drawing. Also, even elements that are not denoted by reference numbers may be described with reference to other drawings.

As used herein, relative terms, such as "front side", "back side", "upper side", "top side", "lower side", "bottom side", and the like, may be used herein for ease of description to describe one element or feature's relationship to another element(s) or feature(s) as illustrated in the figures. It will be understood that the relative terms do not refer to specific directions, positions, or elements, but are interchangeably used. For example, the term "front side" or "top side" may be interpreted as the term "back side" or "bottom side", and the term "back side" or "bottom side" may be interpreted as the term "front side" or "top side". Thus, the term "front side" or "top side" may be expressed as a "first side", and the term "back side" or "bottom side" may be expressed as a "second side". In contrast, the term "back side" or "bottom side" may be expressed as a "first side", and the term "front side" or "top side" may be expressed as a "second side". However, to prevent confusion, the terms "front side" and "back side" are not interchangeably used.

In the present specification, the term "near" refers to a state in which any one of at least two elements, for example having symmetric concepts, is relatively close to another specific element. For example, when a first end is near to a first side, the first end may be interpreted as being closer to the first side than a second end, or interpreted as being closer to the first side than a second side.

In the present specification, the term "single-bodied" refers to a state in which a structure is not separated into discrete elements. For example, a single-bodied structure may refer to an unsawed wafer or a package substrate. As such, in that context, the term "single-bodied" refers to a state in which a single wafer or package substrate is not separated into unit chips or unit package substrates having the same function.

As used herein, the term "conductive terminal," refers to an element such as a pad, via, bump, ball, etc., or a combination thereof formed of a conductive material and that may be used to transmit or receive electrical voltage and/or current to or from another element in the system.

Figure 1B:
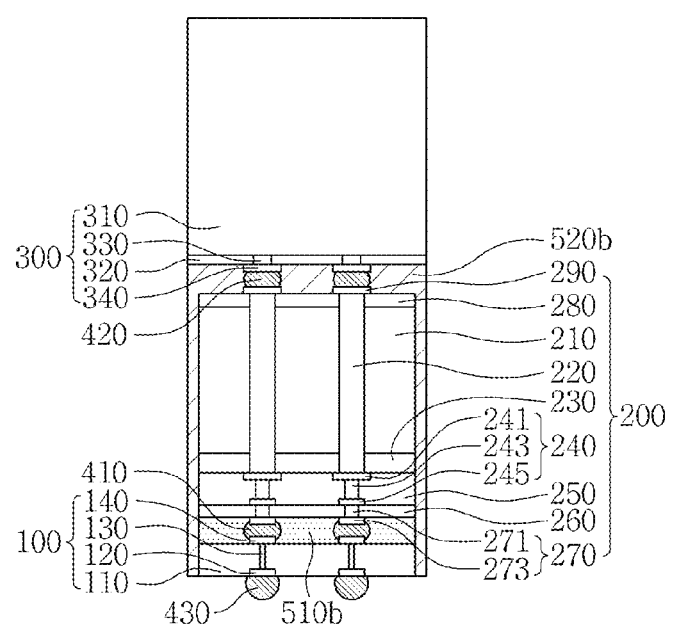
Figure 1C:
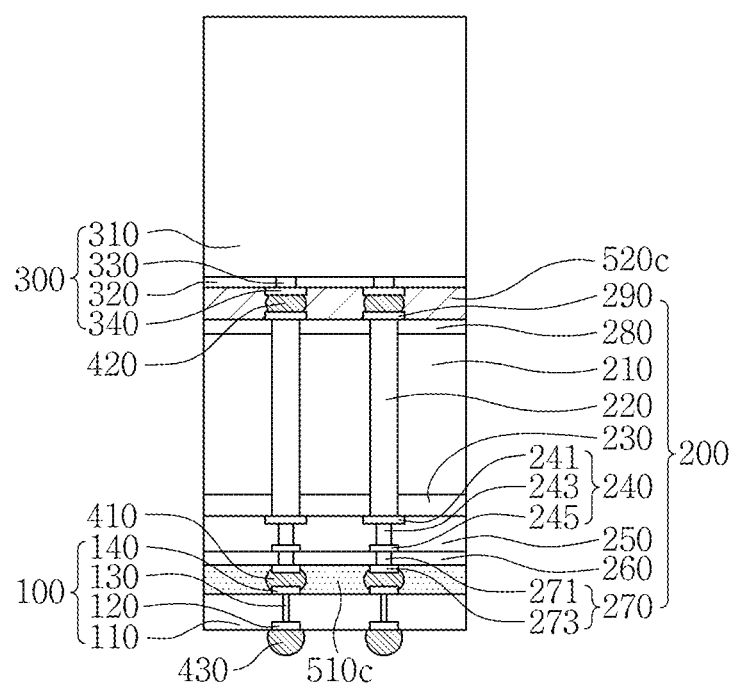

FIGS. 1A through 1C are longitudinal sectional views or side views of multi-chip stack packages 10, 20, and 30 according to certain exemplary embodiments.

Referring to FIG. 1A, the multi-chip stack package 10 according to one embodiment may include a lower chip 200 and an upper chip 300 stacked on a package substrate 100, a lower molding compound 510a interposed between the package substrate 100 and the lower chip 200, and an upper molding compound 520a interposed between the lower chip 200 and the upper chip 300.

The package substrate 100 may include conductive terminals such as substrate bump lands 120 disposed in a bottom surface of a substrate plate 110, substrate vias 130 disposed in the substrate plate 110, and chip bump lands 140 disposed on a top surface of the substrate plate 110. The substrate plate 110 may include, for example, an insulating material, such as a plastic, ceramic, an organic polymer, or an inorganic material. The substrate bump lands 120, the substrate vias 130, and the chip bump lands 140 may include, for example, a metal, such as copper (Cu). Conductive interconnections such as substrate bumps 430 to be electrically connected to a motherboard may be provided on the substrate bump lands 120. The substrate bumps 430 may include, for example, solders. In one embodiment, the package substrate 100 includes a printed circuit board (PCB).

The lower chip 200 may include conductive terminals such as a through-via electrode 220 formed through a lower chip substrate 210, an internal circuit 240, a lower interconnection layer 270, and a top surface pad 290. The lower chip substrate 210 may include semiconductor material such as silicon. The lower chip 200 may include a first insulating layer 230 disposed on a first surface (e.g., bottom surface) of the lower chip substrate 210. The through-via electrode 220 may penetrate the first insulating layer 230. The first insulating layer 230 may include at least one of silicon oxide, silicon nitride, polyimide (PI), and/or photosensitive polyimide (PSPI).

In one embodiment, the internal circuit 240 electrically connects the through-via electrode 220 and the lower interconnection layer 270. The internal circuit 240 may include conductive terminals such as a through-via pad 241, an internal via 243, and an internal interconnection 245. The internal interconnection 245 may include, for example, a redistribution structure.

In one embodiment the through-via pad 241 is disposed on the first insulating layer 230 and aligned to and in contact with the through-via electrode 220. The internal via 243 may have a pillar shape and be disposed on the through-via pad 241. The internal via 243 may transmit an electric signal in a vertical direction. The internal interconnection 245 may be disposed on the internal via 243. The internal interconnection 245 may include re-distribution structures or re-distribution wires. Accordingly, the internal interconnection 245 may transmit an electric signal in a horizontal direction. The internal circuit 240 may include a metal, such as tungsten (W) or copper (Cu).

In one embodiment, the lower chip 200 includes a second insulating layer 250, which may be disposed on the first insulating layer 230 to surround the internal circuit 240. The second insulating layer 250 and the internal interconnection 245 may have surfaces disposed at the same level (e.g., they may be co-planar). The second insulating layer 250 may include, for example, silicon oxide, silicon nitride, PI, or PSPI.

The lower chip 200 may include a lower passivation layer 260, which may be disposed on the second insulating layer 250 to cover the internal interconnection 245. The lower passivation layer 260 may include, for example, silicon oxide, silicon nitride, PI, or PSPI.

The lower interconnection layer 270 may penetrate through the lower passivation layer 260 and electrically connected to the internal interconnection 245. The lower interconnection layer 270 may include conductive terminals such as a lower via plug 271 disposed through the lower passivation layer 260 and a bottom surface pad 273 disposed on the lower passivation layer 260. The lower interconnection layer 270 may include a redistribution structure. The lower via plug 271 and the bottom surface pad 273 may include a metal, such as copper.

The lower chip 200 may further include a top surface insulating layer 280 disposed on a top surface of the lower chip substrate 210. The through-via electrode 220 may penetrate the top surface insulating layer 280. The top surface insulating layer 280 may include silicon oxide, silicon nitride, PI, or PSPI.

In one embodiment, the lower chip 200 includes a top surface pad 290, which may be disposed on the top surface insulating layer 280 and aligned to and in contact with the through-via electrode 220.

The bottom surface pad 273 of the lower chip 200 may be electrically connected to the chip bump land 140 of the substrate plate 110 through chip bumps 410. The chip bumps 410 may include, for example, solders.

The lower molding compound 510a may fill space between the package substrate 100 and the lower chip 200 to surround the chip bumps 410, and directly contact and cover side surfaces of the package substrate 100, for example, side surfaces of the substrate plate 110. The lower molding compound 510a may include a molding compound including, for example, epoxy.

In one exemplary embodiment, the lower chip 200 includes a logic semiconductor device.

The upper chip 300 may include an upper chip passivation layer 320, an upper chip via plug 330, and an upper chip pad 340, which may be formed on a bottom surface of an upper chip substrate 310. The upper chip substrate 310 may include semiconductor material such as silicon, for example. The upper chip passivation layer 320 may include an insulating material, such as silicon oxide, silicon nitride, PI, and/or PSPI, for example. The upper chip via plug 330 may penetrate the upper chip passivation layer 320. The upper chip pad 340 may be disposed on the upper chip passivation layer 320 and aligned to and in contact with the upper chip via plug 330. The upper chip via plug 330 and the upper chip pad 340 may include, for example, tungsten, copper, nickel (Ni), gold (Au), silver (Ag), or tin (Sn).

In one embodiment, the upper chip pad 340 is electrically connected to the top surface pad 290 of the lower chip 200 through inter-chip bumps 420. The inter-chip bumps 420 may include solders, for example.

In one embodiment, the upper chip 300 includes a memory semiconductor device.

The upper molding compound 520a may fill space between the upper chip 300 and the lower chip 200 to surround the inter-chip bumps 420, and cover side surfaces of the lower chip 200, for example, side surfaces of the lower chip substrate 210. The upper molding compound 520 may cover side surfaces of the lower molding compound 510a disposed on the side surfaces of the package substrate 100. The upper molding compound 520a may be a molding compound including epoxy, for example.

In one embodiment, the lower chip 200 has a greater horizontal width than the package substrate 100. In one embodiment, the upper chip 300 has a greater horizontal width than the lower chip 200.

Referring to FIG. 1B, a multi-chip stack package 20 according to one exemplary embodiment may include a lower chip 200 and an upper chip 300 stacked on a package substrate 100, a lower molding compound 510b interposed between the package substrate 100 and the lower chip 200, and an upper molding compound 520b interposed between the lower chip 200 and the upper chip 300. The upper molding compound 520b may fill space between the upper chip 300 and the lower chip 200 to surround inter-chip bumps 420, and cover side surfaces of the lower chip 200, for example, side surfaces of a lower chip substrate 210. The upper molding compound 520b may directly contact and cover side surfaces of the lower molding compound 510b interposed between the package substrate 100 and the lower chip 200. The upper molding compound 520b may directly contact and cover side surfaces of a substrate plate 110.

The lower molding compound 510b may fill space between the package substrate 100 and the lower chip 200 to surround chip bumps 410. In the embodiment of FIG. 1B, the side surfaces of the substrate plate 110 are not covered with the lower molding compound 510b.

Side surfaces of the package substrate 100 may be vertically aligned with the side surfaces of the lower chip 200. The side surfaces of the lower molding compound 510b may be vertically aligned with the side surfaces of the package substrate 100 and the side surfaces of the lower chip 200.

Referring to FIG. 1C, a multi-chip stack package 30 according to one exemplary embodiment may include a lower chip 200 and an upper chip 300 stacked on a package substrate 100, a lower molding compound 510c interposed between the package substrate 100 and the lower chip 200, and an upper molding compound 520c interposed between the lower chip 200 and the upper chip 300. Side surfaces of the package substrate 100, the lower chip 200, and the upper chip 300 may not be covered with the lower molding compound 510c and/or the upper molding compound 520c.

The side surfaces of the package substrate 100, the lower chip 200, and the upper chip 300 may be vertically aligned. Side surfaces of the lower molding compound 510c filled between the package substrate 100 and the lower chip 200 may also be vertically aligned with the side surfaces of the package substrate 100, the lower chip 200, and the upper chip 300. Side surfaces of the upper molding compound 520c filled between the lower chip 200 and the upper chip 300 may also be vertically aligned with the side surfaces of the package substrate 100, the lower chip 200, and the upper chip 300. The side surfaces of the lower molding compound 510c may be vertically aligned with the side surfaces of the upper molding compound 520c.

FIGS. 2A through 2F are conceptual longitudinal sectional views or side views of multi-chip stack packages 11, 12, 21, 22, 31, and 32 according to various exemplary embodiments.

Referring to FIGS. 2A through 2F, each of the multi-chip stack packages (11, 12, 21, 22, 31, and 32) according to various embodiments include a lower chip 200, a middle chip 600, and an upper chip 300 stacked on a package substrate 100, a lower molding compound 710a, 710b, . . . or 710f interposed between the package substrate 100 and the lower chip 200, a middle molding compound 730a, 730b, . . . or 730f interposed between the lower chip 200 and the middle chip 600, and an upper molding compound 720a, 720b, . . . , or 720f interposed between the middle chip 600 and the upper chip 300.

The middle chip 600 may include a through-via electrode 620 formed through a middle chip substrate 610, an internal circuit 640, a lower interconnection layer 670, and a top surface pad 690. The middle chip 600 may include a third insulating layer 630 disposed on a first surface (e.g., bottom surface) of the middle chip substrate 610. The through-via electrode 620 may penetrate the third insulating layer 630. The third insulating layer 630 may include, for example, silicon oxide, silicon nitride, PI, or PSPI. The internal circuit 640 may electrically connect the through-via electrode 620 and the lower interconnection layer 670. The internal circuit 640 may include a through-via pad 641, an internal via 643, and an internal interconnection 645. The internal circuit 640 may include, for example, a redistribution structure. The through-via pad 641 may be disposed on the third insulating layer 630 and aligned to and in contact with the through-via electrode 620. In one embodiment, the internal via 643 has a pillar shape and is disposed on the through-via pad 641. The internal via 643 may transmit an electric signal in a vertical direction. The internal interconnection 645 may be disposed on the internal via 643. The internal interconnection 645 may include re-distribution structures or re-distribution wires. Accordingly, the internal interconnection 645 may transmit an electric signal in a horizontal direction. The internal circuit 640 may include, for example, a metal, such as tungsten or copper.

The middle chip 600 may include a fourth insulating layer 650, which may be disposed on the third insulating layer 630 to surround the internal circuit 640. The fourth insulating layer 650 and the internal interconnection 645 may have surfaces disposed at the same level. The fourth insulating layer 650 may include, for example, silicon oxide, silicon nitride, or PI.

The middle chip 600 may include a lower passivation layer 660, which may be disposed on the fourth insulating layer 650 to cover the internal interconnection 645. The lower passivation layer 660 may include, for example, silicon oxide, silicon nitride, PI, or PSPI.

In one embodiment, the middle chip 600 includes a lower interconnection layer 670, which is formed through the lower passivation layer 660 and is electrically connected to the internal interconnection 645. The lower interconnection layer 670 may include a lower via plug 671 formed through the lower passivation layer 660 and a bottom surface pad 673 disposed on the lower passivation layer 660. The lower interconnection layer 670 may include, for example, a redistribution structure. The lower via plug 671 and the bottom surface pad 673 may include a metal, such as copper.

The middle chip 600 may include a top surface insulating layer 680 disposed on a top surface of the middle chip substrate 610. The through-via electrode 620 may penetrate the top surface insulating layer 680. The top surface insulating layer 680 may include, for example, silicon oxide, silicon nitride, or PI.

The middle chip 600 may include a top surface pad 690, which may be disposed on the top surface insulating layer 680 and aligned to and in contact with the through-via electrode 620.

The bottom surface pad 673 of the middle chip 600 may be electrically connected to the top surface pad 290 of the lower chip 200 through lower inter-chip bumps 440. The top surface pad 690 of the middle chip 600 may be electrically connected to the upper chip pad 340 of the upper chip 300 through upper inter-chip bumps 420. The lower inter-chip bumps 440 and the upper inter-chip bumps 420 may include solders, for example.

Figure 2A:
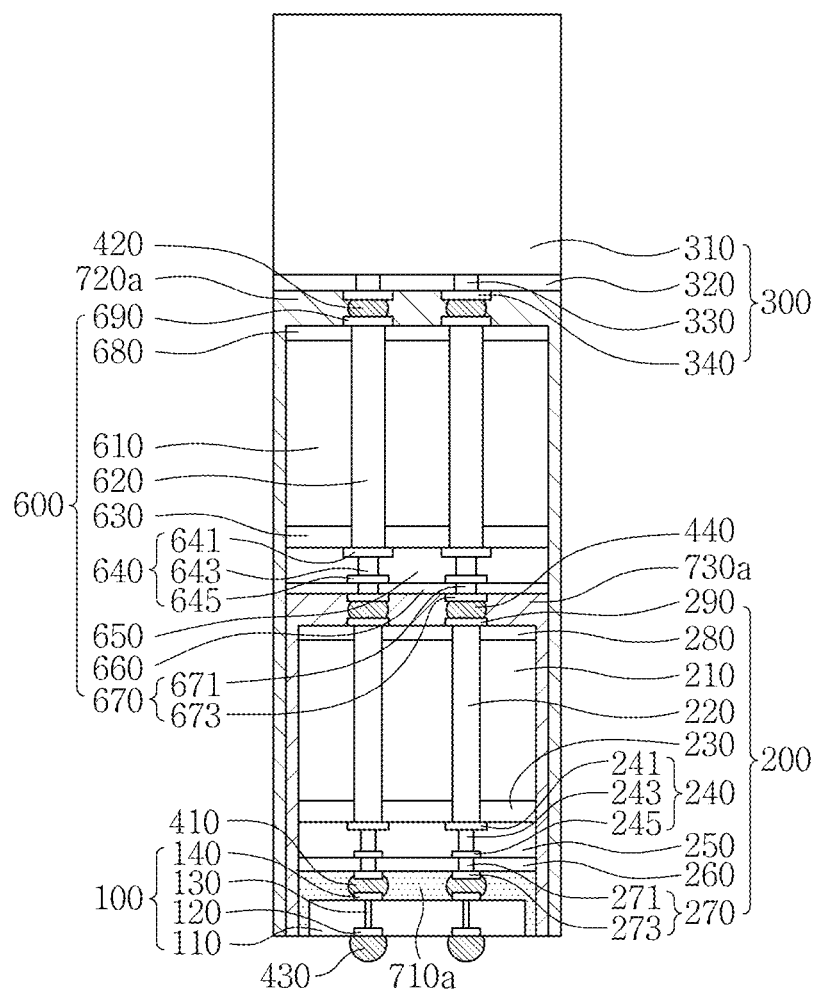

Referring to FIG. 2A, the lower chip 200 may have a greater horizontal width than the package substrate 100. The middle chip 600 may have a greater horizontal width than the lower chip 200. The upper chip 300 may have a greater horizontal width than the middle chip 600. The lower molding compound 710a may fill space between the package substrate 100 and the lower chip 200 to surround chip bumps 410, and directly contact and cover side surfaces of the package substrate 100, for example, side surfaces of the substrate plate 110. The middle molding compound 730a may fill space between the lower chip 200 and the middle chip 600 to surround the lower inter-chip bumps 440, and cover side surfaces of the lower chip substrate 210 and the lower molding compound 710a. The middle molding compound 730a may include a molding compound containing epoxy, for example. The upper molding compound 720a may fill space between the upper chip 300 and the middle chip 600 to surround the upper inter-chip bumps 420, and cover side surfaces of the middle chip 600, for example, side surfaces of the middle chip substrate 610 and side surfaces of the middle molding compound 730a.

Figure 2B:
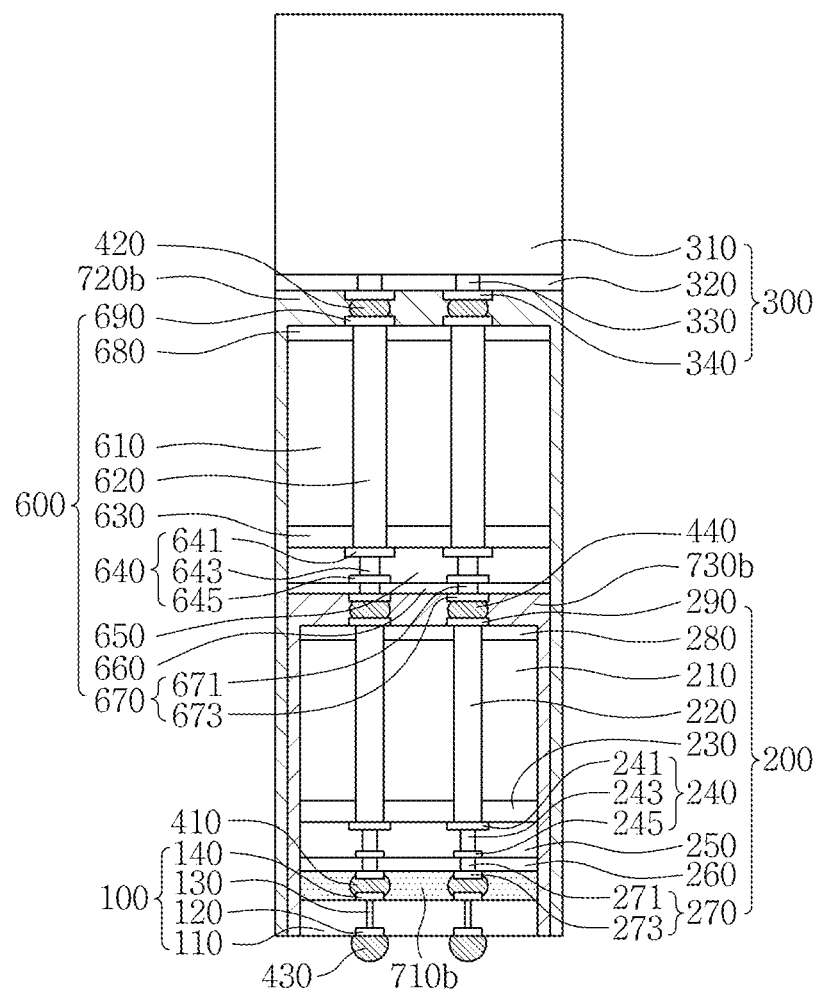

Referring to FIG. 2B, the lower chip 200 may have the same horizontal width as the package substrate 100. The middle chip 600 may have a greater horizontal width than the lower chip 200. The upper chip 300 may have a greater horizontal width than the middle chip 600. The lower molding compound 710b may fill space between the package substrate 100 and the lower chip 200 to surround the chip bumps 410. In one embodiment, side surfaces of the package substrate 100, for example, the side surfaces of the substrate plate 110, are not covered with the lower molding compound 710b. The middle molding compound 730b may fill space between the lower chip 200 and the middle chip 600 to surround the lower inter-chip bumps 440, and cover the side surfaces of the lower chip substrate 210, the side surfaces of the lower molding compound 710b, and the side surfaces of the package substrate 100. The upper molding compound 720b may fill space between the upper chip 300 and the middle chip 600 to surround the upper inter-chip bumps 420, and cover the side surfaces of the middle chip 600, for example, the side surfaces of the middle chip substrate 610 and the side surfaces of the middle molding compound 730b. The lower chip 200 may be vertically aligned with the package substrate 100. For example, the side surfaces of the lower chip substrate 210 and the side surfaces of the lower molding compound 710b may be vertically aligned with the side surfaces of the substrate plate 110 (e.g., they may be co-planar).

Figure 2C:
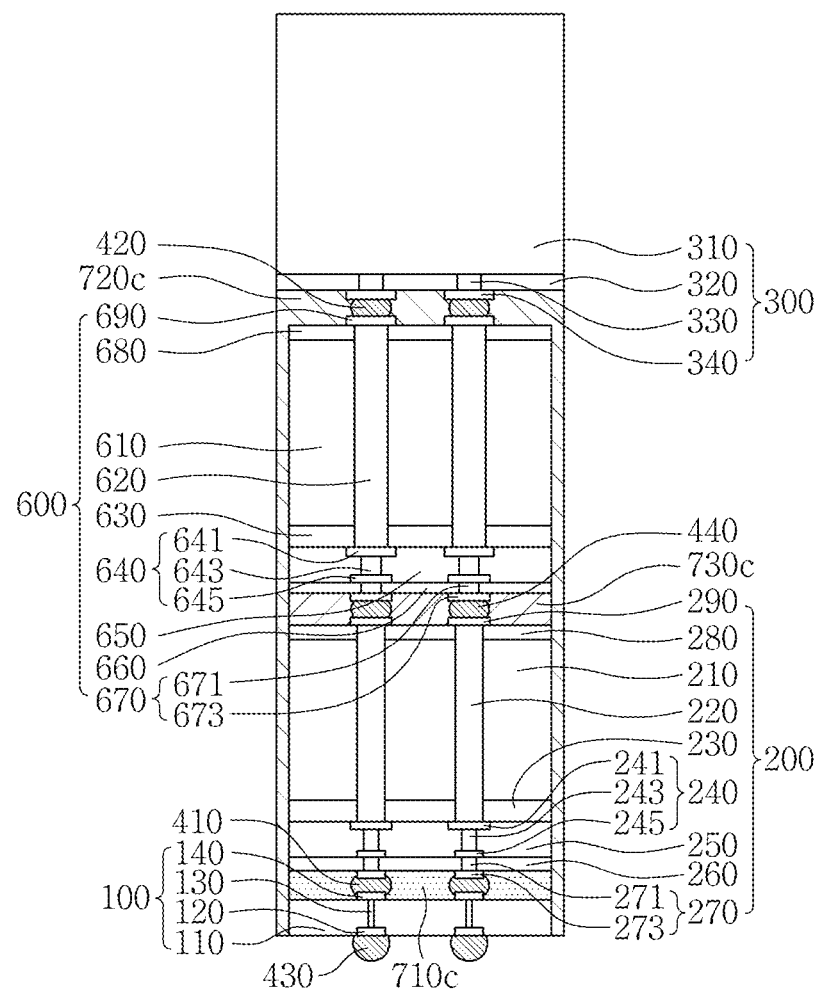

Referring to FIG. 2C, the package substrate 100, the lower chip 200, and the middle chip 600 may have the same horizontal width. The upper chip 300 may have a greater horizontal width than the package substrate 100, the lower chip 200, and the middle chip 600. The lower molding compound 710c may fill space between the package substrate 100 and the lower chip 200 to surround the chip bumps 410. In one embodiment, the side surfaces of the package substrate 100, for example, the side surfaces of the substrate plate 110, not covered with the lower molding compound 710c. The middle molding compound 730c may fill space between the lower chip 200 and the middle chip 600 to surround the lower inter-chip bumps 440. In one embodiment, the side surfaces of the lower chip substrate 210, the side surfaces of the lower molding compound 710c, and the side surfaces of the package substrate 100 are not covered with the middle molding compound 730c. The upper molding compound 720c may fill space between the upper chip 300 and the middle chip 600 to surround the upper inter-chip bumps 420, and directly cover the middle chip 600 (e.g., the side surfaces of the middle chip substrate 610, the side surfaces of the middle molding compound 730c, the side surfaces of the lower chip 200, and the side surfaces of the lower molding compound 710c) and the package substrate 100 (e.g., the side surfaces of the substrate plate 110). The middle chip 600, the lower chip 200, and the package substrate 100 may be vertically aligned. For example, the side surfaces of the middle chip substrate 610, the side surfaces of the middle molding compound 730c, the side surfaces of the lower chip substrate 210, the side surfaces of the lower molding compound 710c, and the side surfaces of the substrate plate 110 may be vertically aligned (e.g., they may be co-planar).

Figure 2D:
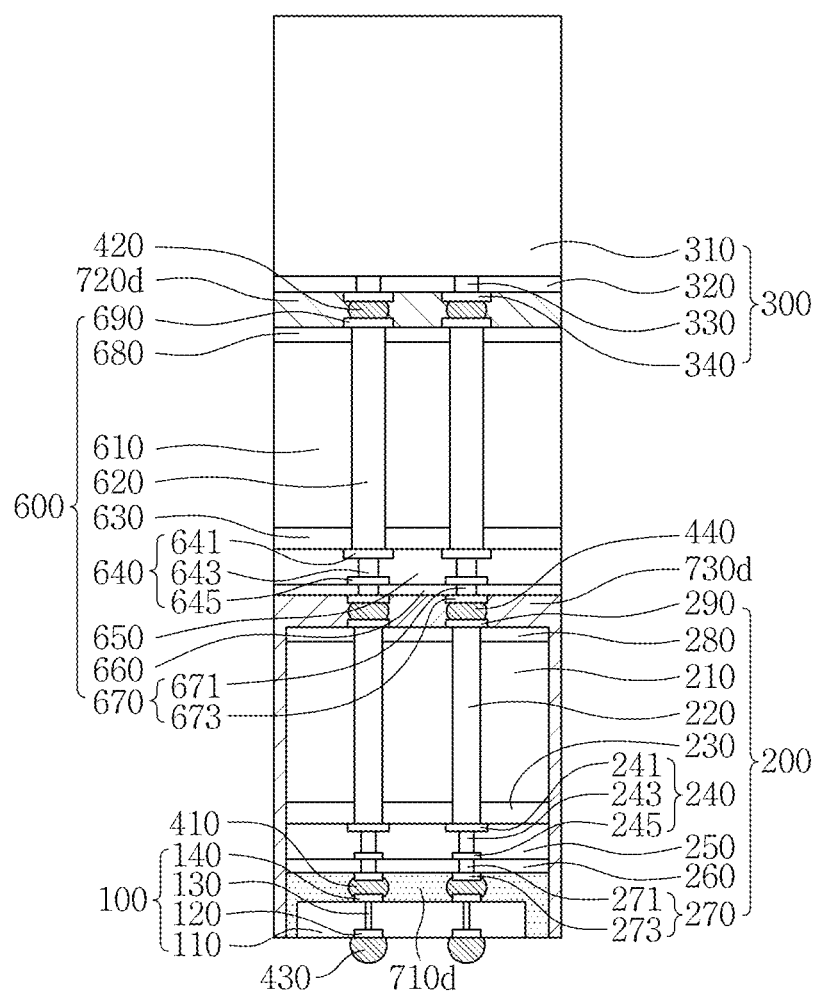

Referring to FIG. 2D, the lower chip 200 may have a greater horizontal width than the package substrate 100. The middle chip 600 may have a greater horizontal width than the lower chip 200. The upper chip 300 and the middle chip 600 may have the same horizontal width. The lower molding compound 710d may fill space between the package substrate 100 and the lower chip 200 to surround the chip bumps 410, and directly contact and cover the side surfaces of the package substrate 100, for example, the side surfaces of the substrate plate 110. The middle molding compound 730d may fill space between the lower chip 200 and the middle chip 600 to surround the lower inter-chip bumps 440, and cover the side surfaces of the lower chip substrate 210 and the lower molding compound 710d. The upper molding compound 720d may fill space between the upper chip 300 and the middle chip 600 to surround the upper inter-chip bumps 420. In one embodiment, the side surfaces of the middle chip 600 (e.g., the side surfaces of the middle chip substrate 610 and the side surfaces of the middle molding compound 730d) are not covered with the upper molding compound 720d. The side surfaces of the lower chip substrate 210 and the side surfaces of the lower molding compound 710e, may be vertically aligned (e.g., they may be co-planar).

Figure 2E:
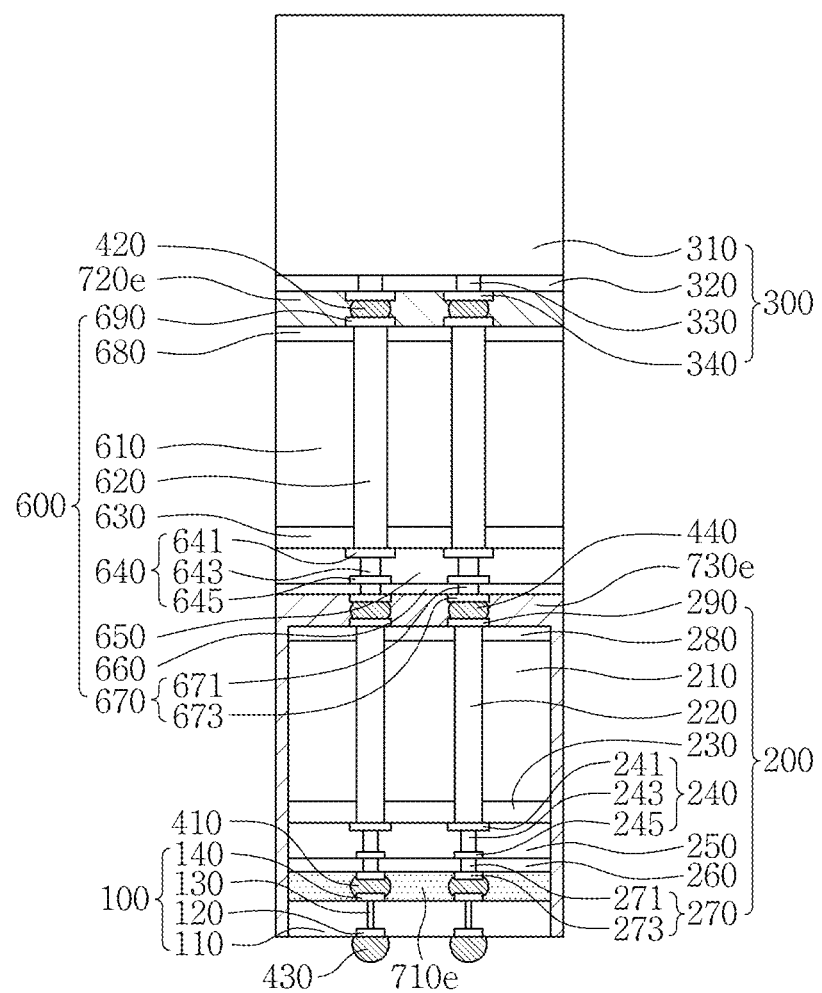

Referring to FIG. 2E, the lower chip 200 may have the same horizontal width as the package substrate 100. The middle chip 600 may have a greater horizontal width than the lower chip 200. The upper chip 300 may have the same horizontal width as the middle chip 600. The lower molding compound 710e may fill space between the package substrate 100 and the lower chip 200 to surround the chip bumps 410. In one embodiment, the side surfaces of the package substrate 100, for example, the side surfaces of the substrate plate 110, not covered with the lower molding compound 710e. The middle molding compound 730e may fill space between the lower chip 200 and the middle chip 600 to surround the lower inter-chip bumps 440, and cover the side surfaces of the lower chip substrate 210, the side surfaces of the lower molding compound 710e, and the side surfaces of the package substrate 100. The upper molding compound 720e may fill space between the upper chip 300 and the middle chip 600 to surround the upper inter-chip bumps 420. In one embodiment, the side surfaces of the middle chip 600, for example, the side surfaces of the middle chip substrate 610 and the side surfaces of the middle molding compound 730e, are not covered with the upper molding compound 720e. The lower chip 200 and the package substrate 100 may be vertically aligned. For example, the side surfaces of the lower chip substrate 210, the side surfaces of the lower molding compound 710e, and the side surfaces of the substrate plate 110 may be vertically aligned (e.g., they may be co-planar).

Figure 2F:
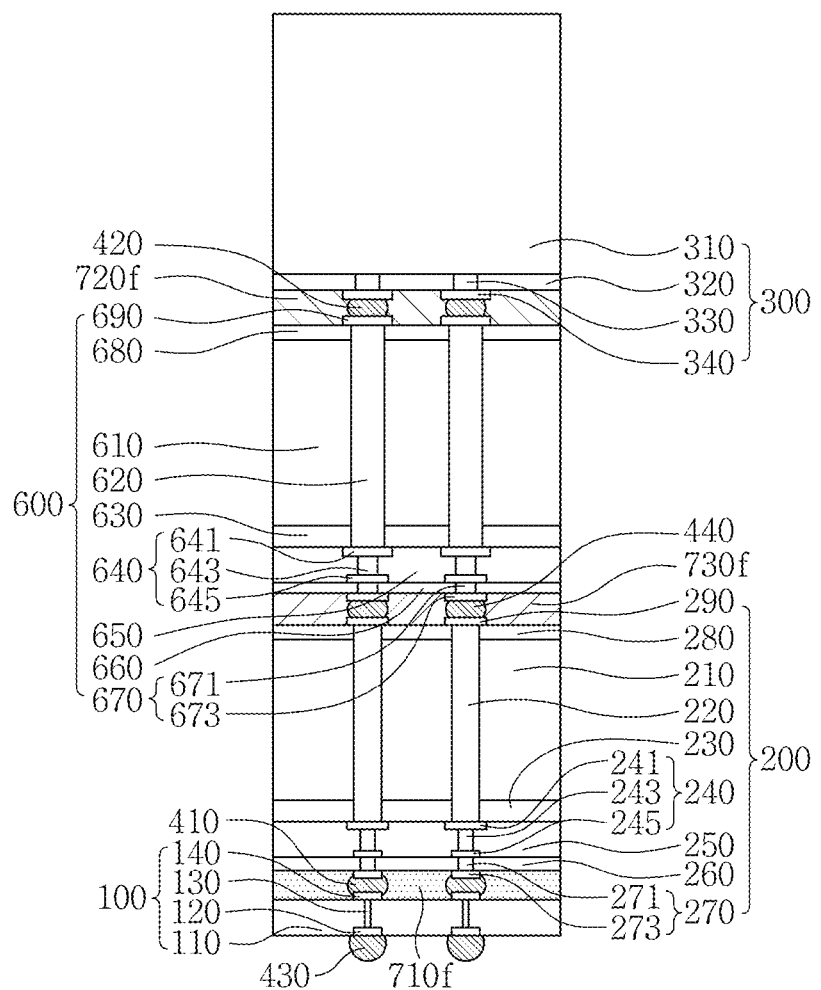

Referring to FIG. 2F, the package substrate 100, the lower chip 200, the middle chip 600, and the upper chip 300 may have the same horizontal width. The lower molding compound 710f may fill space between the package substrate 100 and the lower chip 200 to surround the chip bumps 410. In one embodiment, side surfaces of the package substrate 100 (e.g., the side surfaces of the substrate plate 110) are not covered with the lower molding compound 710f. The middle molding compound 730f may fill space between the lower chip 200 and the middle chip 600 to surround the lower inter-chip 430. In one embodiment, the side surfaces of the lower chip substrate 210, the side surfaces of the lower molding compound 710f, and the side surfaces of the package substrate 100 not covered with the middle molding compound 730f. The upper molding compound 720f may fill space between the upper chip 300 and the middle chip 600 to surround the upper inter-chip bumps 420. In one embodiment, the side surfaces of the middle chip 600 (e.g., the side surfaces of the middle chip substrate 610 and the side surfaces of the middle molding compound 730f) are not covered with the upper molding compound 720f. The upper chip 300 (e.g., the side surfaces of the upper chip substrate 310 and the side surfaces of the upper molding compound 720f), the middle chip 600 (e.g, the side surfaces of the middle chip substrate 610 and the side surfaces of the middle molding compound 730f), the lower chip 200 (e.g., the side surfaces of the lower chip substrate 210 and the side surfaces of the lower molding compound 710f), and the package substrate 100 (e.g., the side surfaces of the substrate plate 110) may be vertically aligned (e.g., they may be co-planar).

FIGS. 3A through 3L are conceptual block diagrams illustrating a method of forming a multi-chip stack package 10 according to certain exemplary embodiments.

Figure 3A:
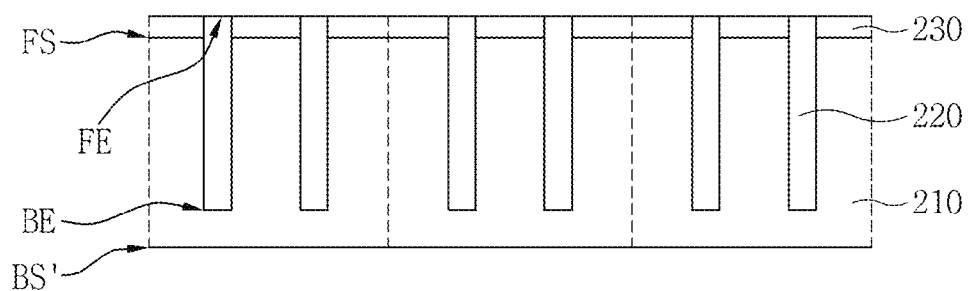
FIGS. 3A through 3L are conceptual longitudinal sectional views or side views illustrating a method of forming a multi-chip stack package according to certain exemplary embodiments.

Referring to FIG. 3A, the method may include preparing a wafer-level single-bodied lower chip substrate 210, and forming through-via electrodes 220 in the lower chip substrate 210. For example, the method may include forming a first insulating layer 230 on a front surface FS of the lower chip substrate 210, and forming through-via electrodes 220 having pillar shapes through the first insulating layer 230 and the lower chip substrate 210 toward a back surface BS' of the lower chip substrate 210. The lower chip substrate 210 may include, for example, a silicon wafer. The through-via electrodes 220 may include, for example, a barrier metal and/or copper. The first insulating layer 230 may include, for example, silicon oxide. Each of the through-via electrodes 220 may have a front end FE, which may protrude from the front surface FS of the lower chip substrate 210 and form a planar surface with the first insulating layer 230, and a back end BE disposed within the lower chip substrate 210. Dotted lines refer to boundaries along which the lower chip substrate 210 will be cut into a plurality of portions in a subsequent process. For example, the dotted lines may refer to scribe lines of a wafer.

Figure 3B:
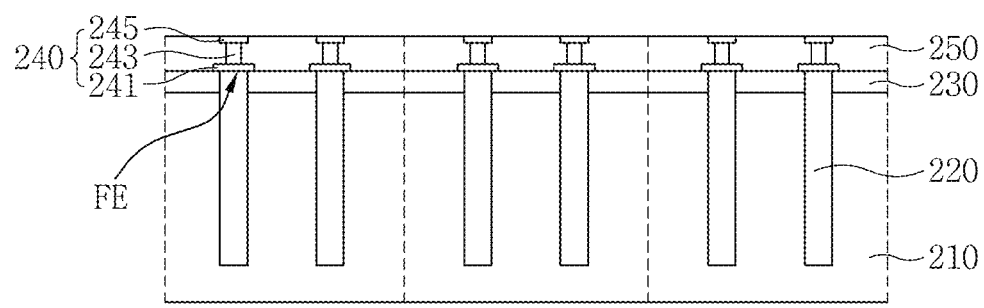

Referring to FIG. 3B, the method may include forming internal circuits 240 on the first insulating layer 230 and the front ends FE of the through-via electrodes 220, and forming a second insulating layer 250 to surround the internal circuits 240. The internal circuits 240 may include through-via pads 241, internal vias 243, and internal interconnections 245. The through-via pads 241 may be formed on the first insulating layer 230 and directly contact the through-via electrodes 220, respectively. The internal vias 243 may have pillar shapes configured to vertically connect the through-via pads 241 and the internal interconnections 245, respectively. The second insulating layer 250 may cover or surround the through-via pads 241, the internal vias 243, and the internal interconnections 245. Top surfaces of the internal interconnections 245 may be disposed at the same level as a top surface of the second insulating layer 250. The internal interconnections 245 may include re-distribution structures or redistribution wires. Accordingly, the internal interconnections 245 may extend in a horizontal direction. The through-via pads 241, the internal vias 243, and the internal interconnections 245 may include a metal, such as copper or tungsten. The second insulating layer 250 may include silicon oxide, for example.

Figure 3C:
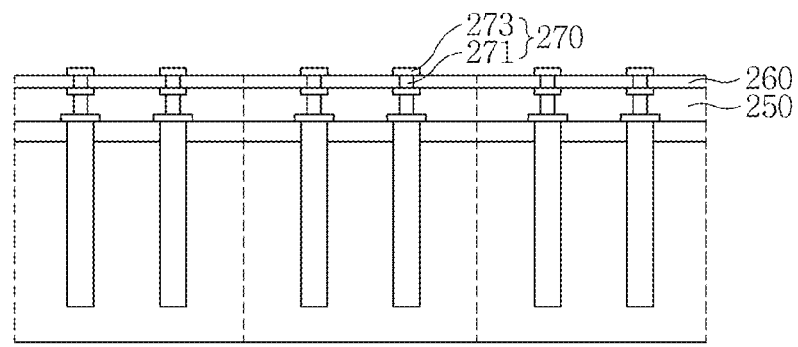

Referring to FIG. 3C, the method may include forming a lower passivation layer 260 and lower interconnection layers 270 on the internal circuits 240. The lower interconnection layers 270 may include lower via plugs 271 and bottom surface pads 273, respectively. The forming the lower interconnection layers 270 may include forming the lower via plugs 271 through the lower passivation layer 260 in contact with the internal interconnections 245, and forming the bottom surface pads 273 on the lower passivation layer 260 in contact with the respective lower via plugs 271. The lower passivation layer 260 may include an insulative material, such as, for example, silicon oxide, silicon nitride, PI, and/or photosensitive PI. The lower via plugs 271 and the bottom surface pads 273 may include a conductive material, such as, for example, tungsten, copper, nickel, gold, silver, or tin. The above-described processes may be performed, thereby forming single-bodied lower chips 200a having the through-via electrodes 220 disposed in the lower chip substrate 210, and the internal circuits 240, the lower passivation layer 260, and the lower interconnection layers 270 disposed on the lower chip substrate 210. The single-bodied lower chips 200a may have a first surface (e.g. at an exposed surface of the lower passivation layer 260) and a second surface opposite the first surface.

Figure 3D:
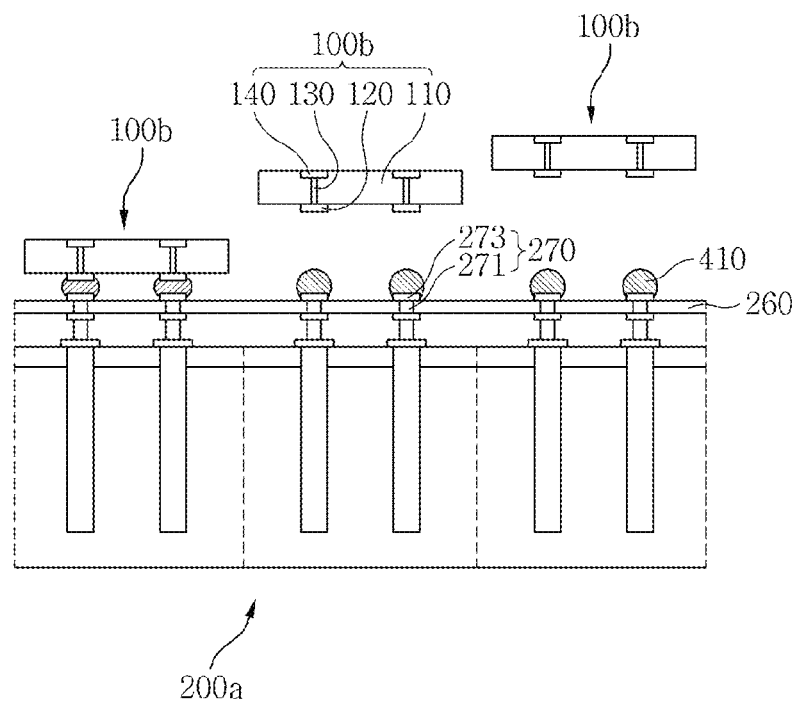

Referring to FIG. 3D, the method may include bonding a plurality of unit package substrates 100b onto the single-bodied lower chips 200a (also described herein as a set of lower chips 200a in a single body), respectively. For example, the unit package substrates 100b can be bonded to the first surface of the single-bodied lower chips. Each of the unit package substrates 100b may include a substrate plate 110, substrate bump lands 120, substrate vias 130, and chip bump lands 140. The bottom surface pads 273 of the single-bodied lower chips 200a may be respectively electrically connected to the chip bump lands 140 of the unit package substrates 100b using the chip bumps 410. Each of the unit package substrates 100b may include, for example, a printed circuit board (PCB) for a semiconductor package. The chip bumps 410 may include solders, for example.

Figure 3E:
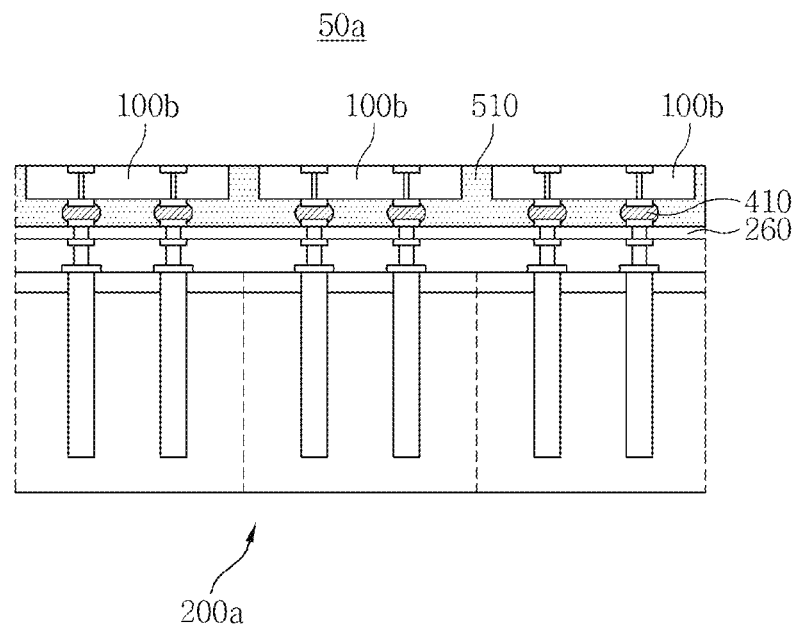

Referring to FIG. 3E, the method may include filling a lower molding compound 510 between the single-bodied lower chips 200a and the unit package substrates 100b. The lower molding compound 510 may surround the chip bumps 410, fill space between the unit package substrates 100b, and cover side surfaces of the unit package substrate 100b. In one embodiment, the lower molding compound 510 includes a material such as resin containing epoxy or an under-fill material. The above-described processes may be performed, thereby forming a single-bodied substrate-chip bonding structure 50a.

Figure 3F:
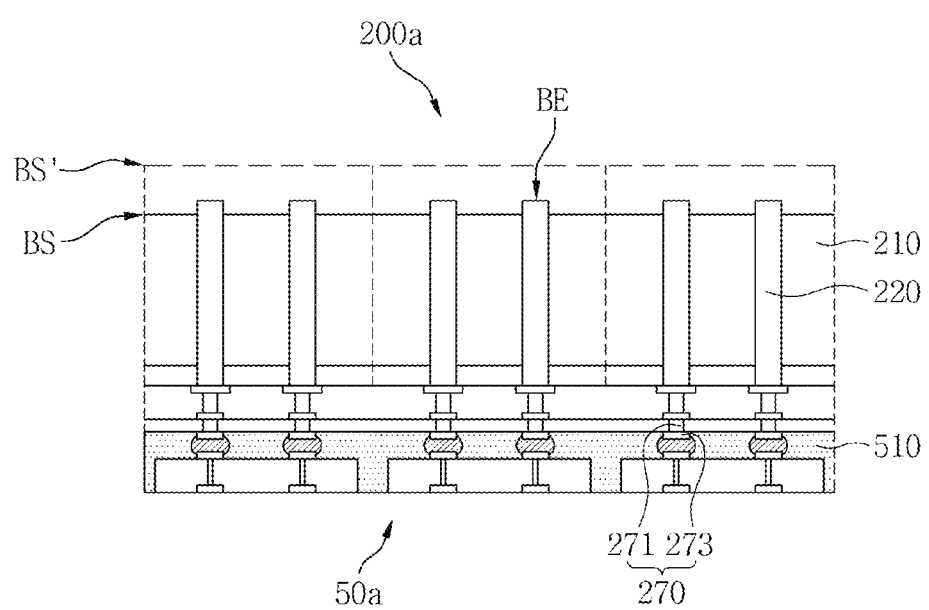

Referring to FIG. 3F, the method may include turning the single-bodied substrate-chip bonding structure 50a upside down, and partially removing the back surface BS' of the lower chip substrate 210 to expose the back ends BE of the through-via electrodes 220. The lower chip substrate 210 may have a back surface BS (also referred to as a second surface) lower than the back ends BE of the through-via electrodes 220, such that the back ends BE of the through-via electrodes 220 protrude beyond the back surface BS of the lower chip substrate 210. In the process described in connection with FIG. 3F, the package substrates 100b, which are formed on the front surface FS of the lower chip substrate 210, and the lower molding compound 510 may support the lower chip substrate 210. For instance, when the package substrate 100b and the lower molding compound 510 are not provided, an additional wafer supporting system should be disposed on the front surface FS of the lower chip substrate 210 and support the lower chip substrate 210. The wafer supporting system is removed after the corresponding process is performed. Therefore, according to the disclosed embodiments, a process of disposing the wafer supporting system on the front surface FS of the lower chip substrate 210 and removing the wafer supporting system may be omitted. Since the package substrates 100b and the lower molding compound 510 are hard, they may support the lower chip substrate 210 during the corresponding process.

Figure 3G:
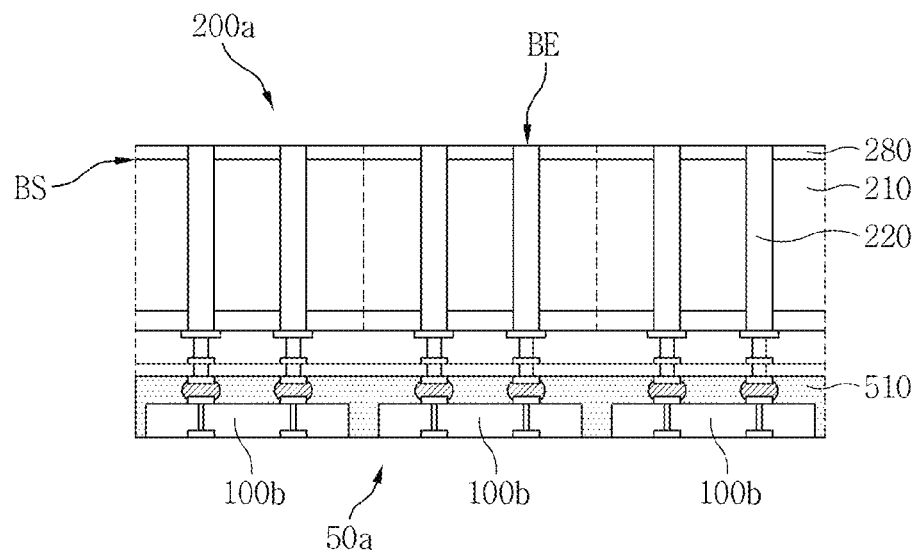

Referring to FIG. 3G, the method may include forming a top surface insulating layer 280 on the back surface BS of the lower chip substrate 210. The top surface insulating layer 280 may expose surfaces of the back ends BE of the through-via electrodes 220. The top surface insulating layer 280 may form a planar surface with the back ends BE of the through-via electrodes 220. The top surface insulating layer 280 may include, for example, silicon oxide, silicon nitride, or a multi-layered insulating layer including silicon oxide and silicon nitride.

Figure 3H:
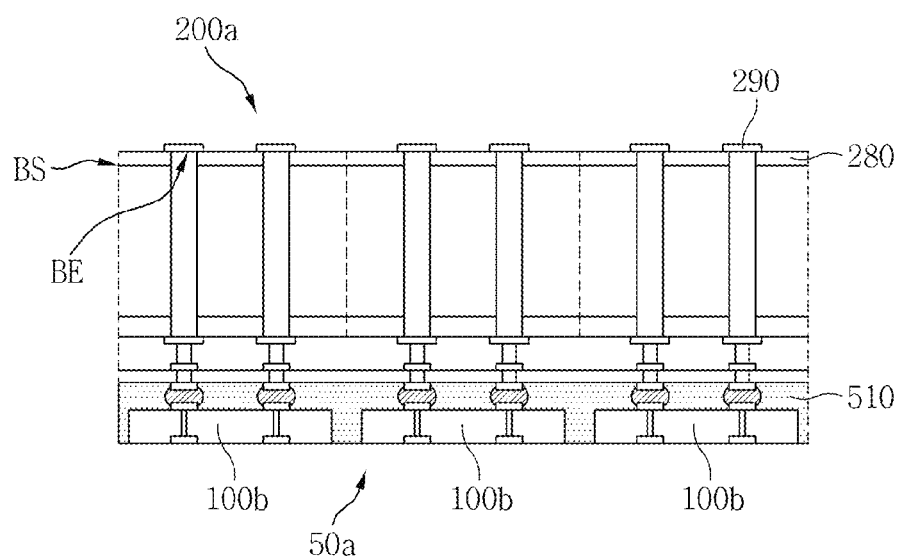

Referring to FIG. 3H, the method may include forming top surface pads 290 on the back ends BE of the through-via electrodes 220. The top surface pads 290 may include a conductive material such as metal (e.g., copper, nickel, gold, silver, or tin).

Figure 3I:
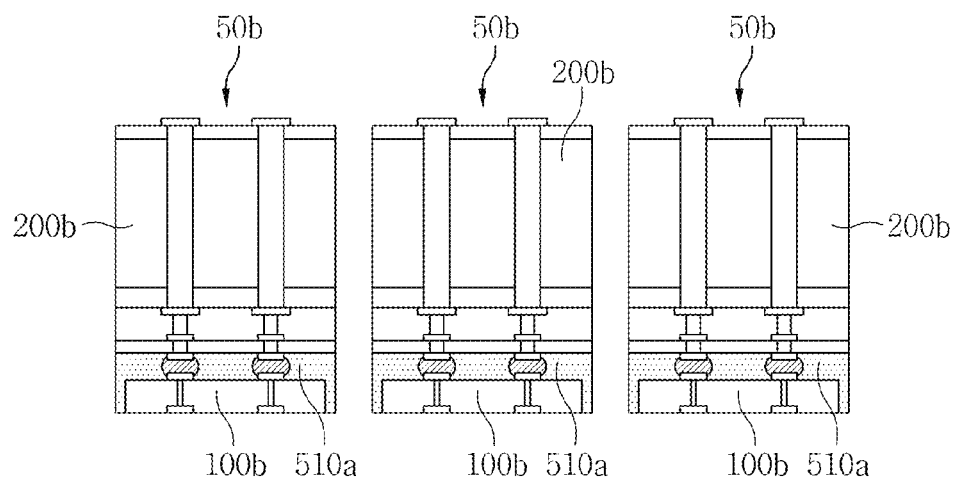

Referring to FIG. 3I, the method may include cutting and separating the single-bodied substrate-chip bonding structure 50a into respective unit substrate-chip bonding structures 50b using a sawing process, a blading process, or a singulating process. After the separation, for each unit substrate-chip bonding structure 50b, the lower molding compound 510a may be disposed on side surfaces of the unit package substrates 100b.

Figure 3J:
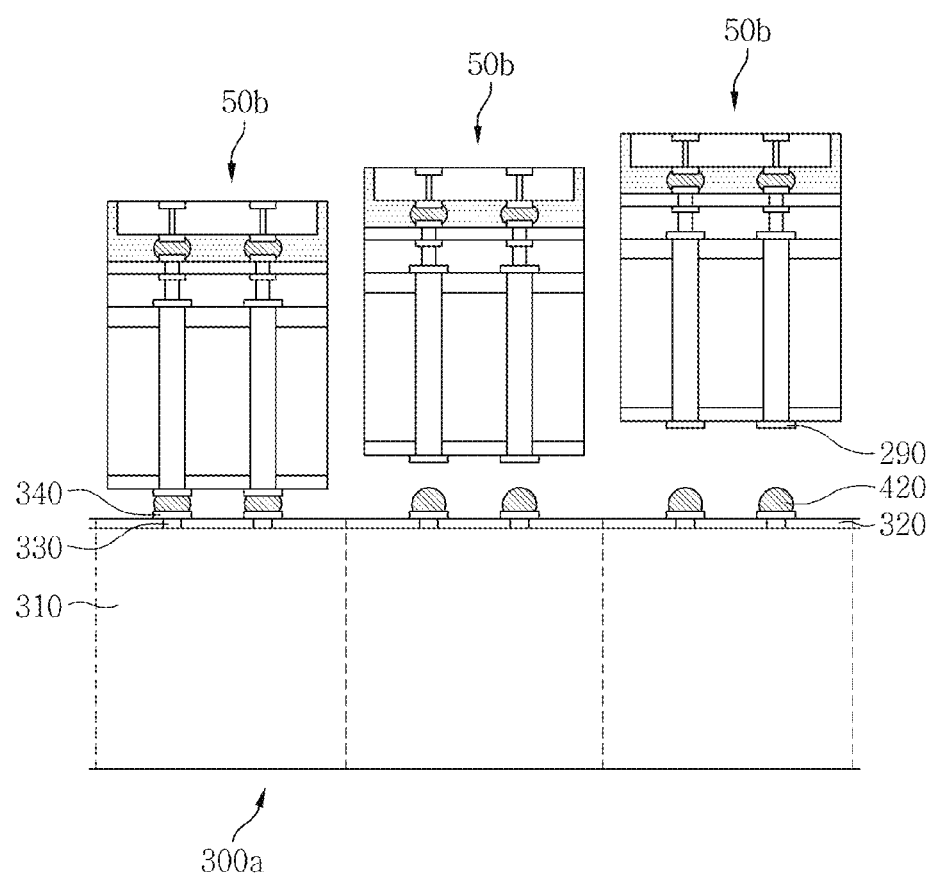

Referring to FIG. 3J, the method may include turning the unit substrate-chip structures 50b upside down and bonding the unit substrate-chip structures 50b onto wafer-level single-bodied upper chips 300a, respectively. Each of the single-bodied upper chips 300a may include an upper chip passivation layer 320 disposed on an upper chip substrate 310, upper chip via plugs 330, and upper chip pads 340. The upper chip substrate 310 may include, for example, a silicon wafer. The upper chip passivation layer 320 may include, for example, silicon nitride, PI, and/or photosensitive PI. The upper chip via plugs 330 and the upper chip pads 340 may include, for example, a metal such as tungsten, copper, nickel, gold, silver, or tin. Dotted lines refer to boundaries along which the upper chip substrate 310 will be cut into a plurality of portions in a subsequent process. For example, the dotted lines may refer to scribe lines. The method may include electrically connecting the bottom surface pads 273 of the unit substrate-chip stack structures 50b with the upper chip pads 340 of the single-bodied upper chips 300a using inter-chip bumps 420. The inter-chip bumps 420 may include solders.

Figure 3K:
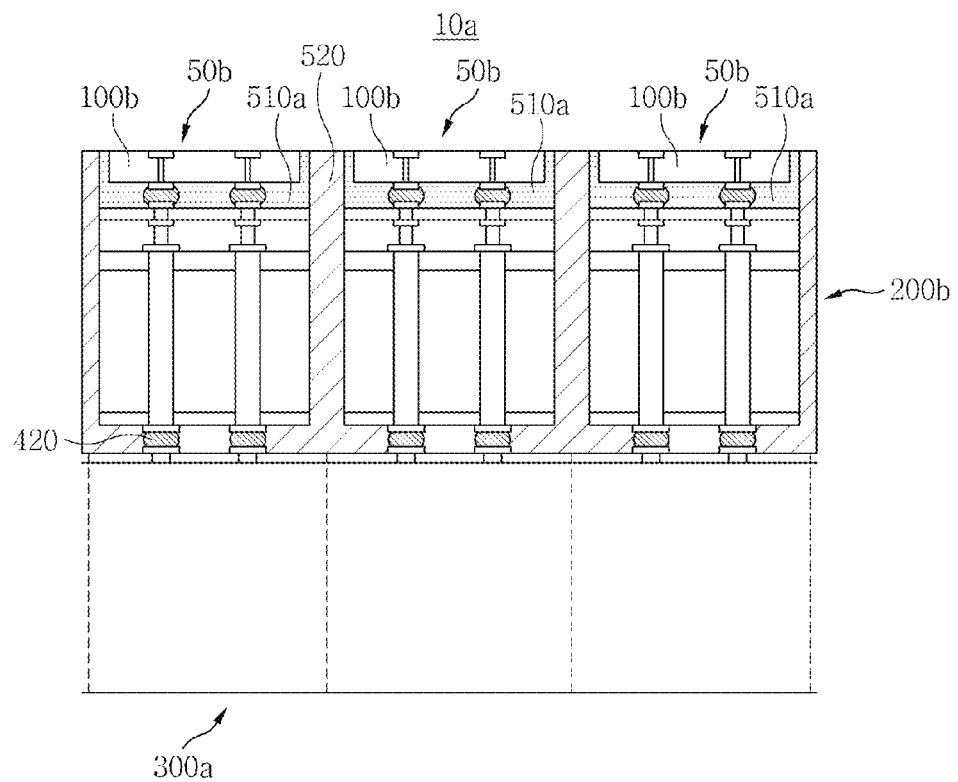

Referring to FIG. 3K, the method may include filling an upper molding compound 520 between the unit substrate-chip structures 50b and the single-bodied upper chips 300a. The upper molding compound 520 may surround the inter-chip bumps 420, fill space between the unit substrate-chip bonding structures 50b, and cover the lower molding compound 510a covering side surfaces of the unit lower chips 200b and the side surfaces of the unit package substrates 100b. The upper molding compound 520 may include, for example, resin including epoxy or an under-fill material. The above-described processes may be performed, thereby forming a single-bodied multi-chip stack package 10a.

Figure 3L:
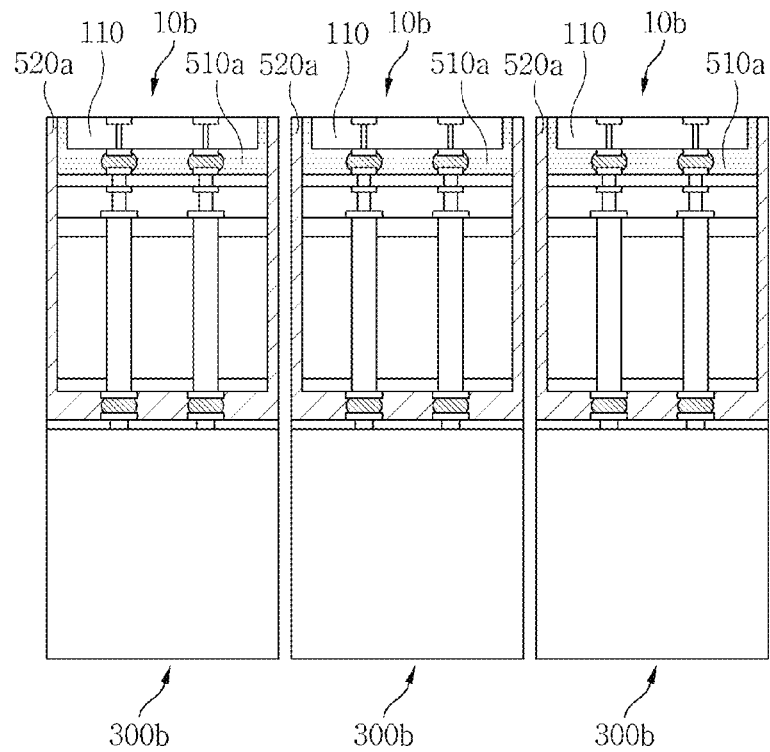

Referring to FIG. 3L, the method may include cutting and separating the single-bodied multi-chip stack package 10a into unit semiconductor chip stack structures 10b. The lower molding compound 510a may surround side surfaces of the substrate plate 110, and the upper molding compound 520a may surround the lower molding compound 510a disposed on sidewalls of the substrate plate 110. Subsequently, referring back to FIG. 1A, the method may further include providing substrate bumps 430 on the substrate bump lands 120 of each of the unit multi-chip stack structures 10b, also referred to herein as chip stack packages, or unit chip stack packages.

In conventional systems, when a unit package substrate has a different horizontal width from a unit lower chip, since chip bump lands of a single-bodied package substrate are not aligned with bottom surface pads of a single-bodied lower chip, a single-bodied package substrate may not be directly bonded to a single-bodied lower chip. However, according to the disclosed embodiments, since each of the separated unit package substrates 100b is independently bonded onto the single-bodied lower chip 200a, even if the unit package substrate 100b has a different horizontal width from the unit lower chip 200b, the substrate-chip bonding structures 50a and 50b may be formed using simple processes.

According to certain embodiments, after the hard package substrate 100 is bonded to the front surface FS of the lower chip substrate 210, the back surface BS of the lower chip substrate 210 may be removed. Accordingly, a wafer supporting system for protecting the internal circuit 240 and the lower interconnection layer 270 disposed on the front surface FS of the lower chip substrate 210 may be omitted. For example, in conventional systems, a structure capable of supporting a lower chip substrate may be temporarily provided on the front surface of a lower chip substrate to prevent the lower chip substrate from being warped or damaged during the process of processing the back surface of the lower chip substrate. Furthermore, since the structure includes an elastic polymer to prevent damage to a lower interconnection layer of the lower chip, when the structure is not clearly removed, the structure may detrimentally affect subsequent processes, thereby reducing yield or degrading the performance of products. Therefore, according to the disclosed embodiments, a process of adhering the structure (e.g., a wafer supporting system) to one surface of the lower chip substrate 210, a process of detaching the structure from the one surface of the lower chip substrate 210, and a cleaning process may be omitted.

Figure 4A:
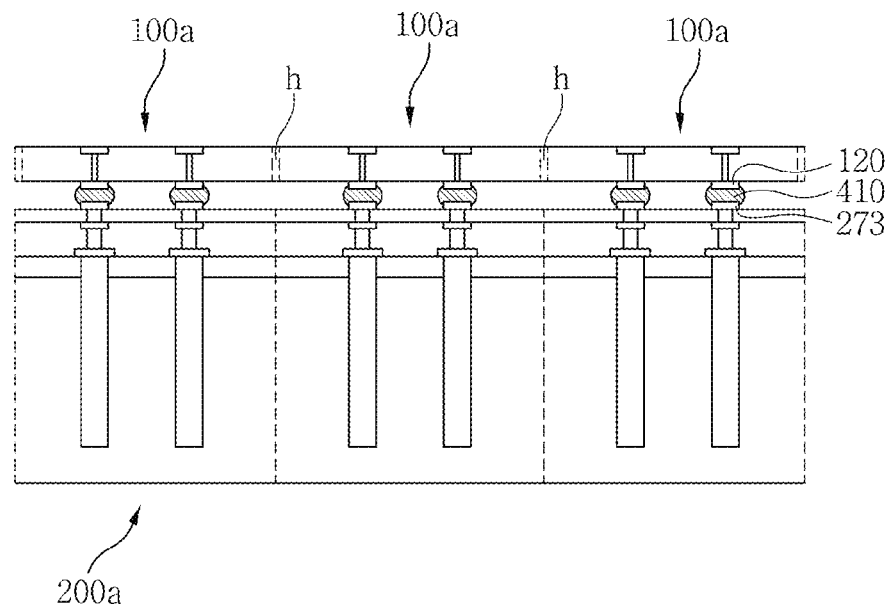
FIGS. 4A through 4F are conceptual longitudinal sectional views or side views illustrating a method of forming a multi-chip stack package according to certain exemplary embodiments.

FIGS. 4A through 4F are longitudinal sectional views illustrating a method of fabricating a multi-chip stack package according to additional exemplary embodiments. Referring to FIG. 4A, the method may include performing processes similar to those described with reference to FIGS. 3A through 3C, to bond a single-bodied package substrate 100a on single-bodied lower chips 200a. The method may include bonding chip bump lands 120 of the single-bodied package substrate 100a to bottom surface pads 273 of the single-bodied lower chips 200a using chip bumps 410. The single-bodied package substrate 100a may remain unseparated, and have holes h selectively disposed at intersections between scribe lines of a lower chip substrate 210. In a top view, each of the holes h may have one of various slit shapes, such as an "O" shape, a rod ( ) shape, a "T" shape, or a cross (X) shape.

Figure 4B:
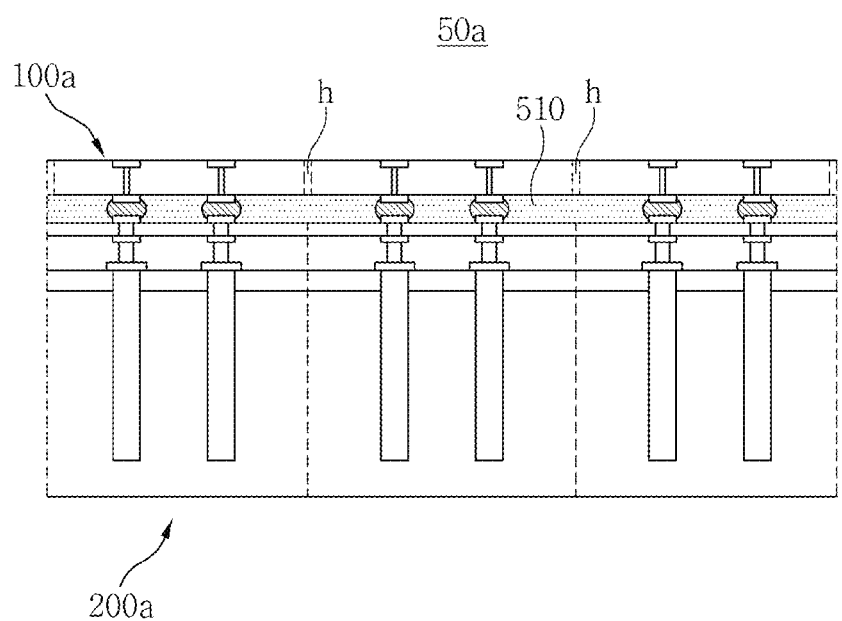

Referring to FIG. 4B, the method may include filling a lower molding compound 510 between the single-bodied lower chips 200a and the single-bodied package substrate 100a. For example, the lower molding compound 510 may be injected through the holes h of the single-bodied package substrate 100a. By performing the above-described processes, a single-bodied substrate-chip bonding structure 50a may be formed.

Figure 4C:
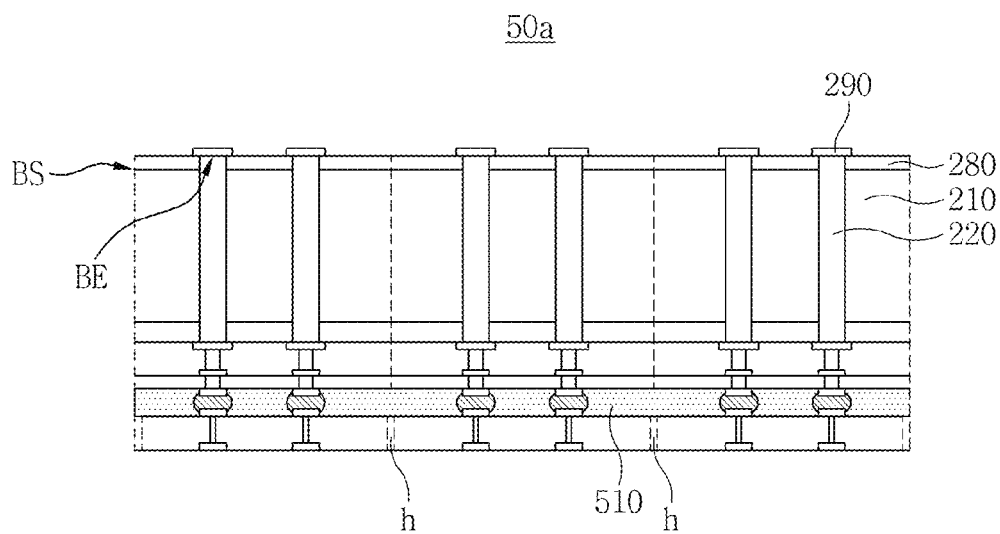

Referring to FIG. 4C, the method may include performing the processes described with reference to FIGS. 3F through 3I. Thus, the method may include forming a top surface insulating layer 280 on a back surface BS of the lower chip substrate 210, and forming top surface pads 290 on back ends of through-via electrodes 220.

Figure 4D:
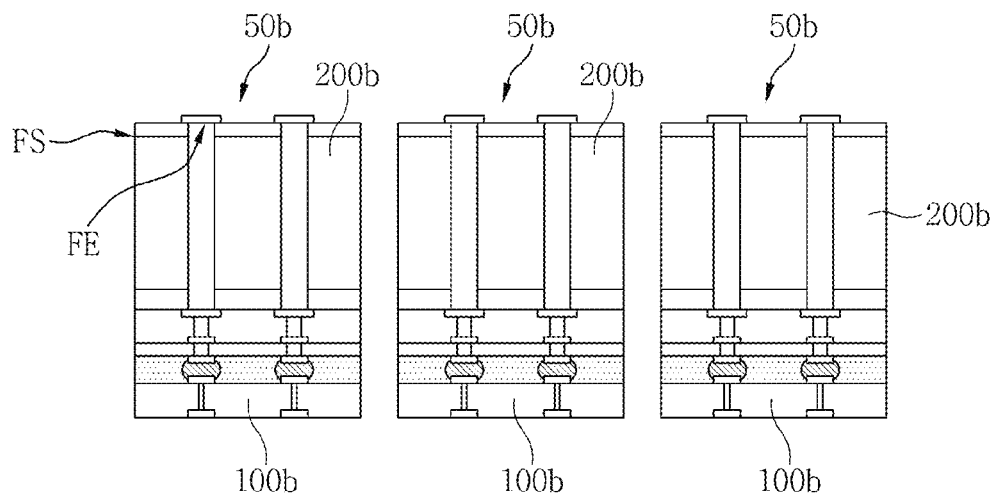

Referring to FIG. 4D, the method of fabricating the multi-chip stack package may include cutting and separating the single-bodied substrate-chip bonding structure 50a into a plurality of unit substrate-chip structures 50b. A lower molding compound 510b may be disposed only between the unit package substrates 100b and the unit lower chips 200b, and is not disposed on side surfaces of the unit package substrates 100b. For example, as shown in FIG. 4C, the side surfaces of the unit package substrates 100b are not covered with the lower molding compound 510b but are exposed.

Figure 4E:
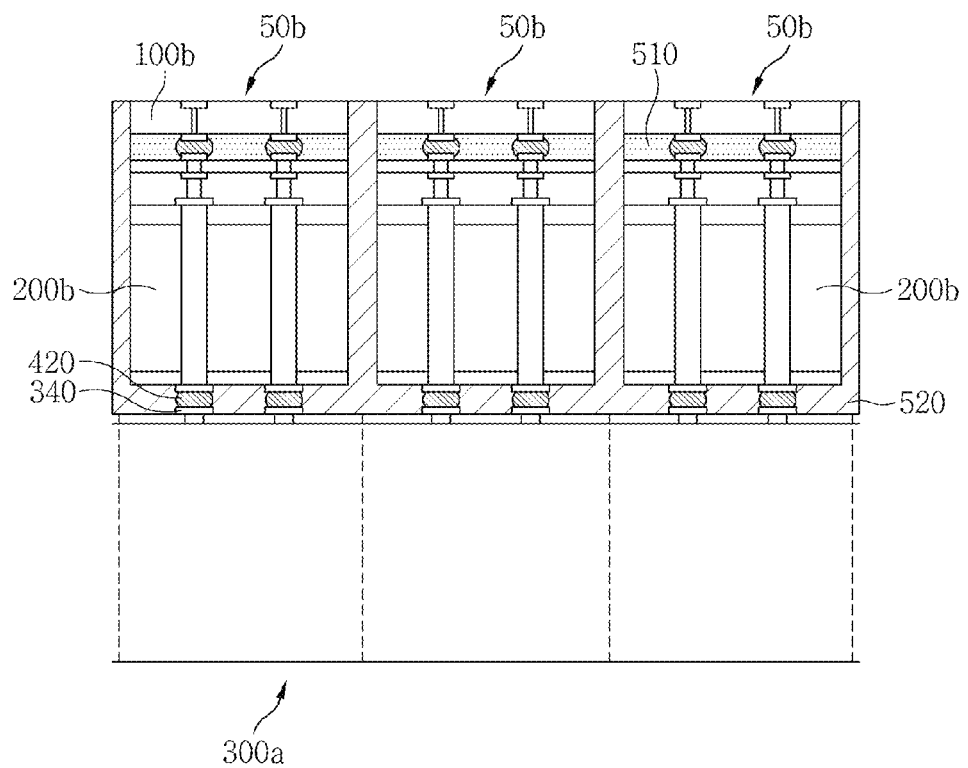

Referring to FIG. 4E, the method may include performing the processes described with reference to FIGS. 3J and 3K. Thus, the method may include bonding the unit substrate-chip bonding structure 50b on single-bodied upper chips 300a, and filling an upper molding compound 520 between the unit substrate-chip structures 50b and the single-bodied upper chips 300a. The upper molding compound 520 may fill space between the unit substrate-chip structures 50b. For example, the upper molding compound 520 may cover sidewalls of package substrates 110 and sidewalls of the lower chip substrate 210. The above-described processes may be performed, thereby forming a single-bodied semiconductor chip stack structure 20a.

Figure 4F:
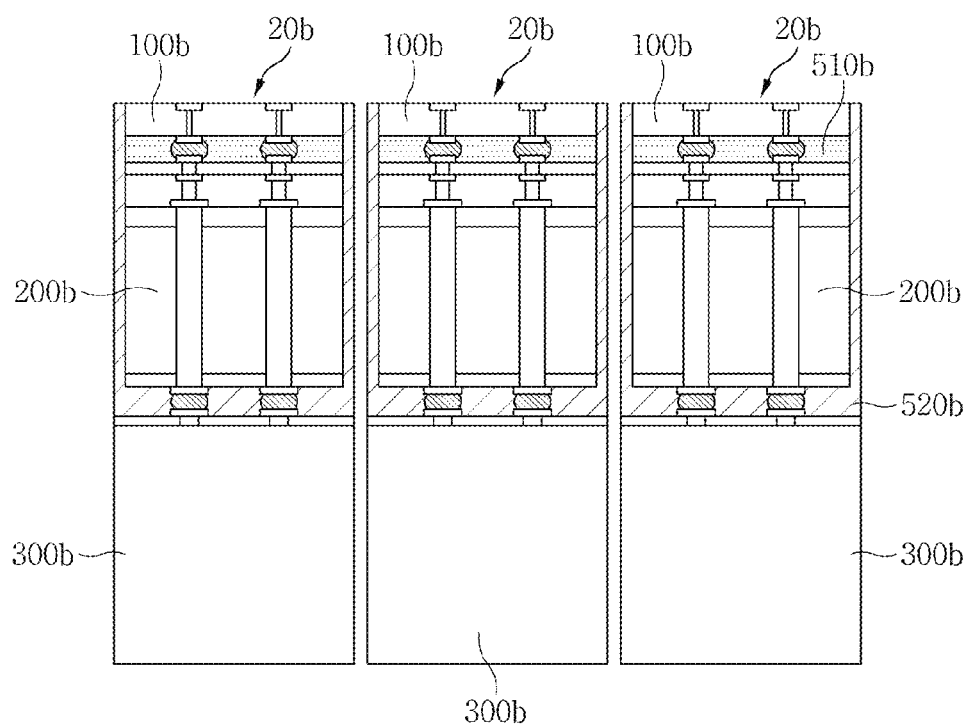

Referring to FIG. 4F, the method may include performing the process described with reference to FIG. 3L to cut and separate the single-bodied semiconductor chip stack structure 20a into unit semiconductor chip stack structures 20b. Sidewalls of the package substrates 110 and sidewalls of the lower chip substrate 210 are not covered with the lower molding compound 510b. The sidewalls of the package substrates 110 and the sidewalls of the lower chip substrates 210 may be covered with an upper molding compound 520b. Subsequently, referring back to FIG. 1B, the method may further include providing substrate bumps 430 on the chip bump lands 140 of each of the unit semiconductor chip stack structures 20b.

For example, in the conventional art when a unit lower chip has a different horizontal width from a unit upper chip, since top surface pads of the single-bodied lower chip are not aligned with upper chip pads of the single-bodied upper chip, the single-bodied lower chip may not be directly bonded to the single-bodied upper chip. However, according to the disclosed embodiments, since each of the separated unit substrate-chip bonding structures 50b is independently bonded to the single-bodied upper chip 300a, even if the unit lower chip 200b and the unit upper chip 300b have different horizontal widths, the semiconductor chip stack structures 20a and 20b may be formed using simple processes. In addition, a process of adhering a wafer supporting system to one surface of the lower chip substrate 210, a process of detaching the wafer supporting system from the one surface of the lower chip substrate 210, and a cleaning process may be omitted.

Figure 5A:
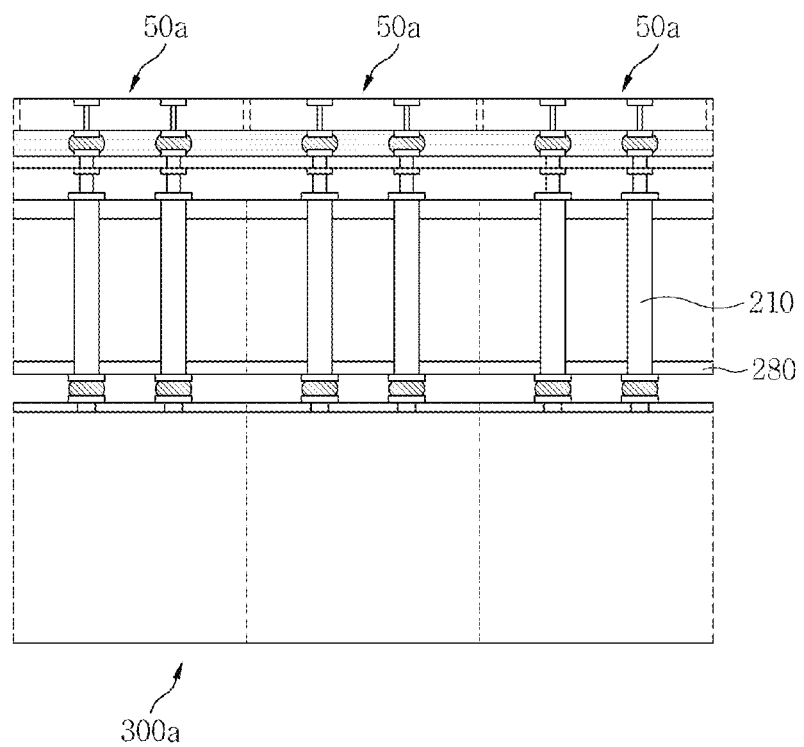
FIGS. 5A through 5C are conceptual longitudinal sectional views or side views illustrating a method of forming a semiconductor stack package according to certain exemplary embodiments.
Figure 5B:
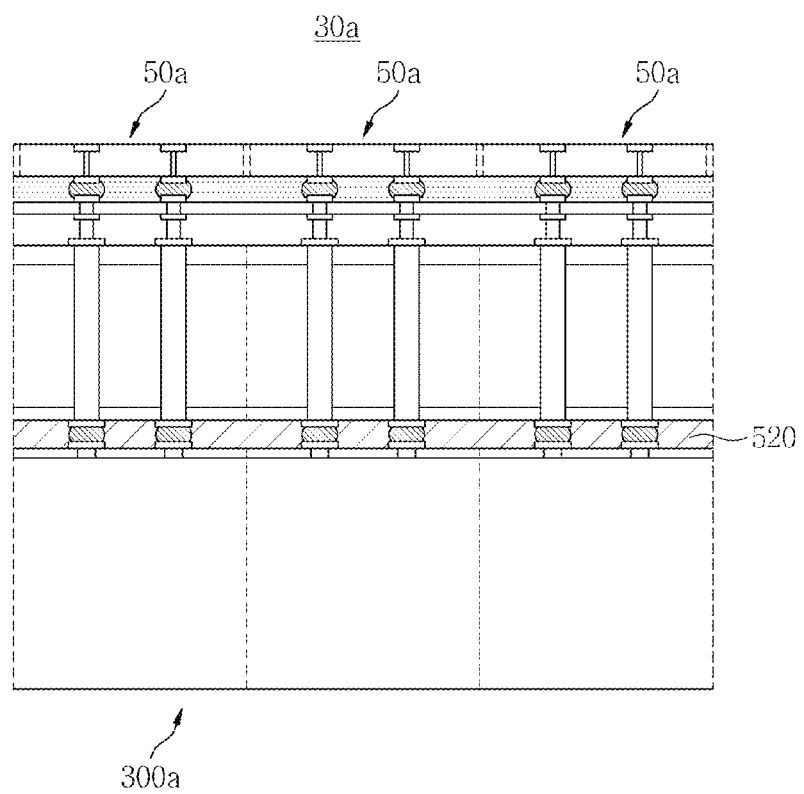
Figure 5C:
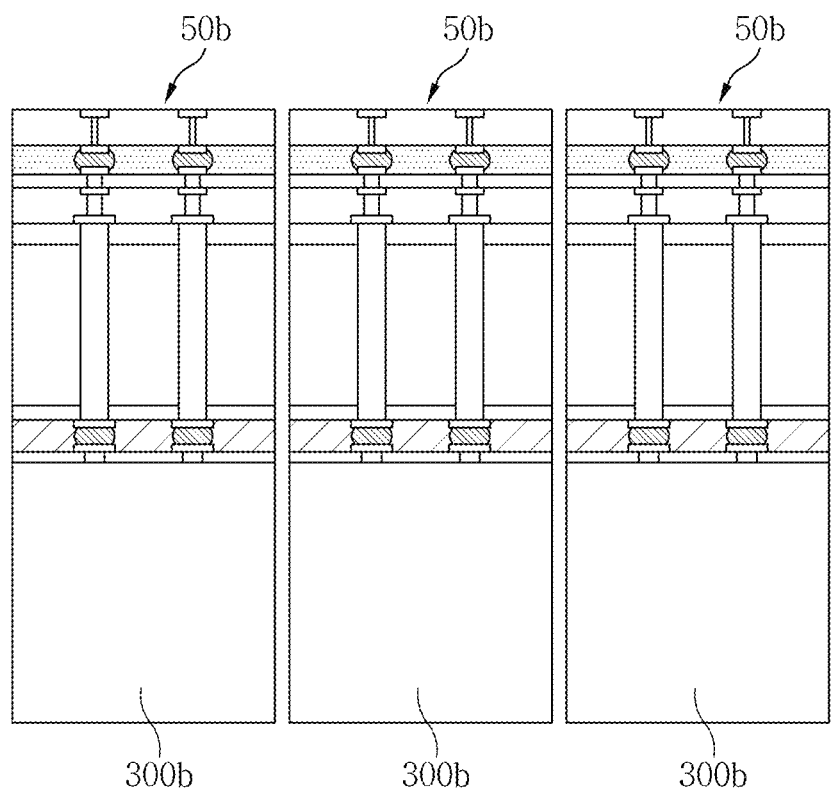

FIGS. 5A through 5C are conceptual longitudinal sectional views or side views illustrating a method of fabricating a semiconductor stack package 30 according to other exemplary embodiments. Referring to FIG. 5A, the method may include performing the processes similar to those described with reference to FIGS. 3A through 3C and 4A through 4C. The method may include forming a single-bodied substrate-chip bonding structure 50a, and bonding the single-bodied substrate-chip bonding structure 50a onto the single-bodied upper chips 300a.

Referring to FIG. 5B, the method may include filling an upper molding compound 520 between the single-bodied substrate-chip bonding structure 50a and the single-bodied upper chips 300a. The upper molding compound 520 may be injected in a lateral direction, for example. The above-described processes may be performed, thereby forming a single-bodied substrate-chip stack structure 30a.

Referring to FIG. 5C, the method may include performing a process such as described with reference to FIG. 3L to cut and separate the single-bodied semiconductor chip bonding structure 50a into unit semiconductor chip stack structures 50b. Subsequently, referring back to FIG. 1C, the method may further include providing substrate bumps 430 on chip bump lands 140 of each of the unit semiconductor chip stack structures 50b.

According to the disclosed embodiments, a process of adhering a wafer supporting system on one surface of the lower chip substrate 210, a process of detaching the wafer supporting system, and a cleaning process may be omitted.

Figure 6A:
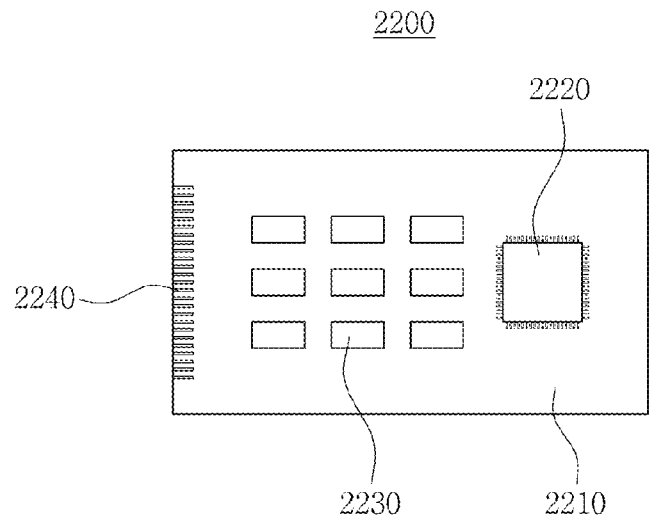
FIG. 6A is a conceptual diagram of a semiconductor module including at least one multi-chip stack package according to one exemplary embodiment.

FIG. 6A is a conceptual diagram of a semiconductor module 2200 including at least one of multi-chip stack packages 10, 20, and 30 according to various exemplary embodiments. Referring to FIG. 6A, the semiconductor module 2200 according to certain embodiments may include one of the multi-chip stack packages 10, 20, and 30, also referred to herein as semiconductor devices, according to the various embodiments described herein, which may be mounted on a semiconductor module substrate 2210. The semiconductor module 2200 may further include a microprocessor (MP) 2220 mounted on the semiconductor module substrate 2210. Input/output (I/O) terminals 2240 may be disposed on at least one side of the module substrate 2210. The semiconductor module 2200 may also include a memory card, such as a solid-state drive (SSD).

Figure 6B:
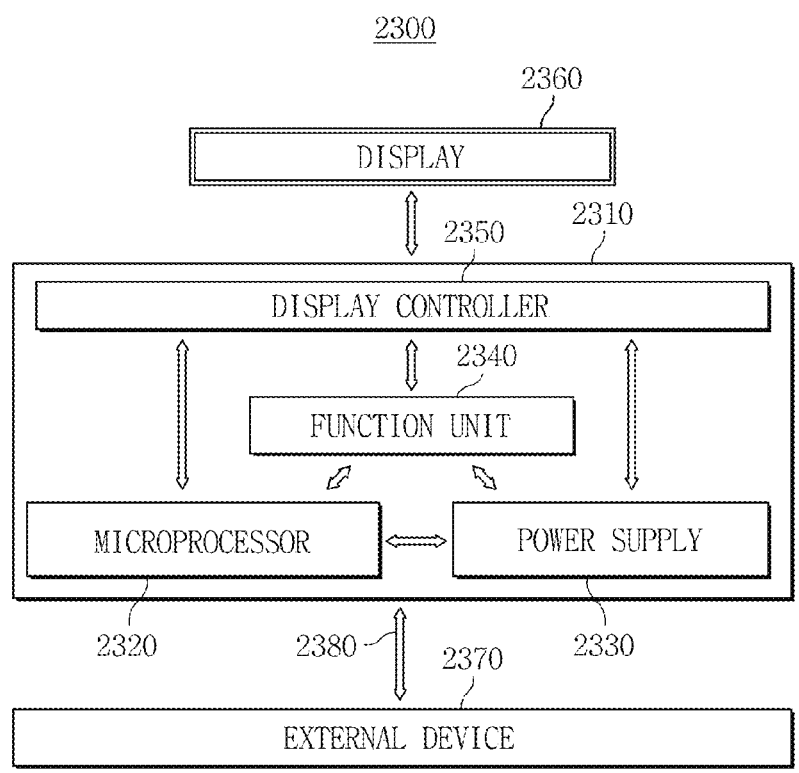
FIG. 6B is a conceptual block diagram of an electronic system including at least one multi-chip stack package according to one exemplary embodiment.

FIG. 6B is a conceptual block diagram of an electronic system 2300 including at least one of multi-chip stack packages 10, 20, and 30 according to various exemplary embodiments. Referring to FIG. 6B, the multi-chip stack packages 10, 20, and 30 according to certain embodiments may be applied to the electronic system 2300. The electronic system 2300 may include a body 2310. The body 2310 may include an MP 2320, a power supply 2330, a function unit 2340, and/or a display controller 2350. The body 2310 may be a system board or motherboard having a PCB. The MP 2320, the power supply 2330, the function unit 2340, and the display controller 2350 may be mounted on the body 2310. A display 2360 may be disposed on a top surface of the body 2310 or outside the body 2310. For example, the display 2360 may be disposed on a surface of the body 2310 and display an image processed by the display controller 2350. The power supply 2330 may receive a predetermined voltage from an external power source, divide the predetermined voltage into various voltage levels, and transmit the divided voltages to the MP 2320, the function unit 2340, and the display controller 2350. The MP 2320 may receive a voltage from the power supply 2330 and control the function unit 2340 and the display 2360. The function unit 2340 may implement various functions of the electronic system 2300. For instance, when the electronic system 2300 is a mobile electronic product, such as a portable phone, the function unit 2340 may include several elements capable of wireless communication functions, such as output of an image to the display 2360 or output of a voice to a speaker, by dialing or communication with an external device 2370. When the function unit 2340 includes a camera, the function unit 2340 may serve as an image processor. In other embodiments, when the electronic system 2300 is connected to a memory card to increase capacity, the function unit 2340 may be a memory card controller. The function unit 2340 may exchange signals with the external device 2370 through a wired or wireless communication unit 2380. In addition, when the electronic system 2300 needs a universal serial bus (USB) to expand functions thereof, the function unit 2340 may serve as an interface controller. Multi-chip stack packages 10, 20, and 30 described in various embodiments herein may be included in at least one of the MP 2320 and the function unit 2340.

Figure 6C:
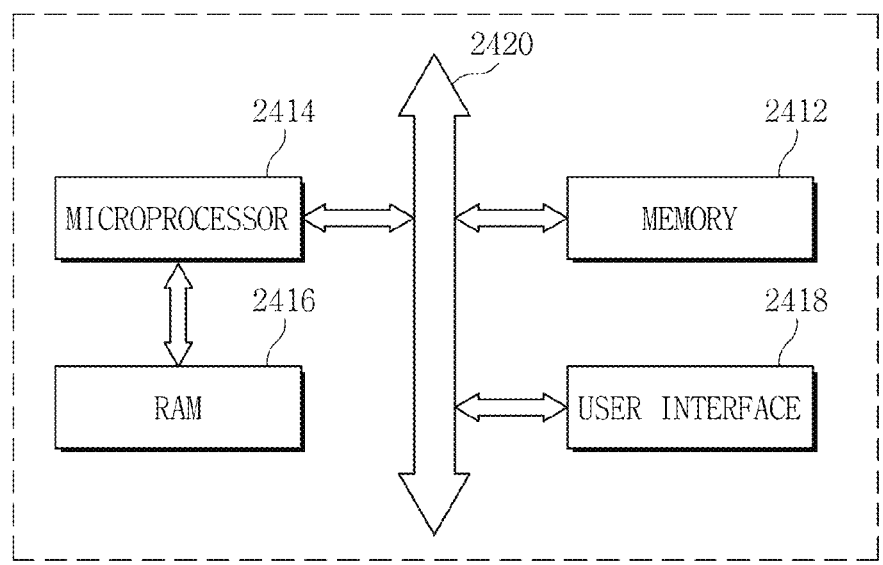
FIG. 6C is a schematic block diagram of another electronic system including at least one multi-chip stack package according to one exemplary embodiment.

FIG. 6C is a schematic block diagram of another electronic system 2400 including at least one of multi-chip stack packages 10, 20, and 30 according to various exemplary embodiments. Referring to FIG. 6C, the electronic system 2400 may include at least one of the multi-chip stack packages 10, 20, and 30 according to certain embodiments described herein. The electronic system 2400 may be used to fabricate a mobile device or computer. For example, the electronic system 2400 may include a memory system 2412, an MP 2414, a random access memory (RAM) 2416, and a user interface 2418 configured to communicate data using a bus 2420. The MP 2414 may program and control the electronic system 2400. The RAM 2416 may be used as an operation memory of the MP 2414. For instance, the MP 2414 or the RAM 2416 may include at least one of the multi-chip stack packages 10, 20, and 30 according to embodiments of the inventive concept. The MP 2414, the RAM 2416, and/or other elements may be assembled within a single package. The user interface 2418 may be used to input data to the electronic system 2400 or output data from the electronic system 2400. The memory system 2412 may store codes for operating the MP 2414, data processed by the MP 2414, or external input data. The memory system 2412 may include, for example, a controller and a memory.

Figure 6D:
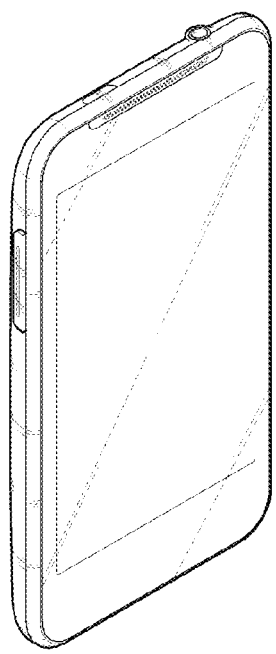
FIG. 6D is a schematic diagram of a mobile device including at least one multi-chip stack package according to one exemplary embodiment.

FIG. 6D is a schematic diagram of a mobile device 2500 including at least one of multi-chip stack packages 10, 20, and 30 according to various exemplary embodiments described herein. The mobile device 2500 may be interpreted as a mobile phone or a tablet personal computer (PC). Furthermore, at least one of the multi-chip stack packages 10, 20, and 30 according to various disclosed embodiments may be used not only for a tablet PC but also for a portable computer such as a laptop computer, an MPEG-1 audio layer 3 (MP3) player, an MP4 player, a navigation device, a solid-state disk (SSD), a desktop computer, or electronic devices for automotive and household uses.

A multi-chip stack package according to various embodiments can include a package substrate, a lower semiconductor chip, and an upper semiconductor chip, which may have various sizes. The multi-chip stack package may also include a middle semiconductor chip between the lower and upper semiconductor chips. A method of fabricating a multi-chip stack package according to various embodiments can include stacking a package substrate, a lower semiconductor chip, and an upper semiconductor chip having different sizes. The method of fabricating the multi-chip stack package according to various embodiments can provide a method of fabricating a multi-chip stack package without using a wafer supporting system. Various effects of other embodiments will be mentioned in the specification.

The foregoing is illustrative of embodiments and is not to be construed as limiting thereof. Although a few embodiments have been described, those skilled in the art will readily appreciate that many modifications are possible without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures.

What is claimed is:

1. A method of fabricating a multi-chip stack package, the method comprising:
   preparing single-bodied lower chips having a single-bodied lower chip substrate having a first surface and a second surface disposed opposite the first surface;
   bonding unit package substrates onto the first surface of the single-bodied lower chip substrate to form a single-bodied substrate-chip bonding structure;
   separating the single-bodied substrate-chip bonding structure into a plurality of unit substrate-chip bonding structures;

preparing single-bodied upper chips having a single-bodied upper chip substrate;

bonding the plurality of unit substrate-chip bonding structures onto a first surface of the single-bodied upper chip substrate to form a single-bodied semiconductor chip stack structure; and separating the single-bodied semiconductor chip stack structure into a plurality of unit semiconductor chip stack structures.

2. The method of claim 1, wherein each of the single-bodied lower chip substrate and the single-bodied upper chip substrate includes an uncut silicon wafer.

3. The method of claim 1, further comprising:

filling a lower molding compound between the first surface of the single-bodied lower chip substrate and the unit package substrates; and filling an upper molding compound between the first surface of the single-bodied upper chip substrate and a surface of the single-bodied lower chips opposite the first surface of the single-bodied lower chip substrate.

4. The method of claim 3, further comprising:

forming a through-via electrode in the single-bodied lower chip substrate, the through-via electrode having a first end protruding from the first surface of the single-bodied lower chip substrate, and a second end disposed in the single-bodied lower chip substrate toward the second surface of the single-bodied lower chip substrate;

forming internal circuits and an interlayer insulating layer on the first surface of the single-bodied lower chip substrate, the interlayer insulating layer surrounding the internal circuits; and forming a first pad on the interlayer insulating layer to be connected to the through-via electrode.

5. The method of claim 4, wherein each unit package substrate comprises:

a substrate plate;

a chip bump land disposed on one surface of the substrate plate and aligned with the first pad; and a substrate bump land disposed on the other surface of the substrate plate and connected to the chip bump land.

6. The method of claim 5, wherein the first pad and the chip bump land are electrically connected using the chip bump, and the lower molding compound surrounds side surfaces of the chip bump.

7. The method of claim 4, further comprising partially removing the second surface of the single-bodied lower chip substrate to expose the second end of the through-via electrode;

forming a second surface insulating layer on the second surface of the single-bodied lower chip substrate to expose a surface of the second end of the through-via electrode; and forming a second pad through the second surface insulating layer to be electrically connected to the second end of the through-via electrode.

8. The method of claim 7, wherein the single-bodied upper chip substrate includes an upper chip pad aligned with the second pad.

9. The method of claim 8, wherein the second pad and the upper chip pad are electrically connected using an inter-chip bump, and the upper molding compound surrounds side surfaces of the inter-chip bump.

10. The method of claim 3, wherein each of the unit substrate-chip bonding structures comprises:

a unit lower chip substrate into which the single-bodied lower chip substrate is divided;

a unit package substrate bonded onto the unit lower chip substrate; and the lower molding compound filled between the unit lower chip substrate and the unit package substrate, wherein the lower molding compound covers side surfaces of the unit package substrate.

11. The method of claim 10, wherein the upper molding compound covers side surfaces of the unit lower chip substrate, side surfaces of the lower molding compound filled between the unit lower chip substrate and the unit package substrate, and side surfaces of the lower molding compound covering the side surfaces of the unit package substrate.

12. The method of claim 3, wherein each of the unit semiconductor chip stack structures comprises:

a unit upper chip substrate into which the single-bodied upper chip substrate is divided;

a unit substrate-chip bonding structure bonded onto the unit upper chip substrate; and the upper molding compound filled between the unit upper chip substrate and the second surface of the unit lower chip substrate of the unit substrate-chip bonding structure, wherein the upper molding compound covers side surfaces of the unit substrate-chip bonding structure.

13. The method of claim 3, wherein for each single-bodied substrate-chip bonding structure, a horizontal width of the unit package substrate is less than a horizontal width of the lower chip.

14. A method of fabricating a multi-chip stack package, the method comprising:

preparing single-bodied lower chips including a wafer-level lower semiconductor chip substrate;

bonding a package substrate onto a first surface of the single-bodied lower chips;

filling a lower molding compound between the lower semiconductor chip substrate and the package substrate to form a single-bodied substrate-chip bonding structure;

separating the single-bodied substrate-chip bonding structure into a plurality of unit substrate-chip bonding structures;

preparing wafer level single-bodied upper chips including a wafer-level upper semiconductor chip substrate;

bonding the plurality of unit substrate-chip bonding structures onto a first surface of the wafer-level upper semiconductor chip substrate;

filling an upper molding compound between the first surface of the upper semiconductor chip substrate and the unit substrate-chip bonding structure to form a single-bodied semiconductor chip stack structure; and separating the single-bodied semiconductor chip stack structure into a plurality of unit semiconductor chip stack structures.

15. The method of claim 14, wherein the package substrate includes a plurality of unit package substrates, and the lower molding compound covers side surfaces of the unit package substrates.

16. The method of claim 15, wherein the upper molding compound covers side surfaces of the plurality of unit substrate-chip bonding structures.

17. The method of claim 14, wherein at least one separated lower chip or separated upper chip has a larger horizontal width than the a separated package substrate on which it is disposed.

18. A method of manufacturing a semiconductor device, the method comprising:

forming a set of lower chips in an unseparated configuration;

attaching a plurality of unit package substrates to the set of lower chips, so that conductive terminals at a surface of each unit package substrate align with conductive terminals at a facing surface of each respective lower chip;

depositing a molding compound between each unit package substrate and its respective lower chip to form a single-bodied substrate-chip bonding structure; and performing a separation process on the single-bodied substrate-chip bonding structure to form a plurality of unit substrate-chip bonding structures.

19. The method of claim 18, wherein each unit substrate-chip bonding structure includes a unit package substrate having a first horizontal width, and a lower chip having a second horizontal width greater than the first horizontal width.

20. The method of claim 19, wherein the molding compound covers a first surface of the unit package substrate facing the lower chip, and also covers side surfaces of the unit package substrate.

* * * * *